United States Patent
de Rochemont

(10) Patent No.: US 9,881,915 B2
(45) Date of Patent: Jan. 30, 2018

(54) POWER FET WITH A RESONANT TRANSISTOR GATE

(71) Applicant: L. Pierre de Rochemont, Austin, TX (US)

(72) Inventor: L. Pierre de Rochemont, Austin, TX (US)

(*) Notice: Subject to any disclaimer, the term of this patent is extended or adjusted under 35 U.S.C. 154(b) by 0 days.

(21) Appl. No.: 14/868,700

(22) Filed: Sep. 29, 2015

(65) Prior Publication Data

US 2016/0225759 A1    Aug. 4, 2016

Related U.S. Application Data

(63) Continuation of application No. 14/325,129, filed on Jul. 7, 2014, now Pat. No. 9,153,532, which is a
(Continued)

(51) Int. Cl.
*H01L 21/00* (2006.01)
*H01L 27/06* (2006.01)
(Continued)

(52) U.S. Cl.
CPC ........ *H01L 27/0629* (2013.01); *G06F 1/3203* (2013.01); *H01L 23/528* (2013.01); *H01L 23/5222* (2013.01); *H01L 23/5227* (2013.01); *H01L 23/5228* (2013.01); *H01L 23/64* (2013.01); *H01L 23/645* (2013.01); *H01L 23/66* (2013.01); *H01L 25/16* (2013.01); *H01L 28/10* (2013.01); *H01L 28/20* (2013.01); *H01L 28/40* (2013.01); *H01L 29/0634* (2013.01); *H01L 29/4238* (2013.01); *H01L 29/42376* (2013.01); *H01L 29/43* (2013.01); *H01L 29/435* (2013.01); *H01L 29/7395* (2013.01); *H01L 29/78* (2013.01); *H01L 29/7803* (2013.01);
(Continued)

(58) Field of Classification Search
CPC H01L 27/0629; H01L 29/7395; H01L 29/435
See application file for complete search history.

(56) References Cited

U.S. PATENT DOCUMENTS 3,315,096 A * 4/1967 Carlson ............... H03B 5/24
                                                    148/DIG. 43
3,585,466 A * 6/1971 Davis, Jr. ............ H01L 29/00
                                                    257/254
(Continued)

FOREIGN PATENT DOCUMENTS

| CN | 103180955 A * | 6/2013 | ............ H01L 23/64 |
| EP | 2609626 A1 * | 7/2013 | ............ H01L 23/64 |
| EP | 2609626 A4 * | 12/2014 | ............ H01L 23/64 |
| JP | H0888359 A | 4/1996 | |
| WO | 2006039699 | 4/2006 | |

(Continued)

OTHER PUBLICATIONS

European Patent Application No. 11820554.1, European Patent Office Search Report, dated Oct. 6, 2016.
(Continued)

*Primary Examiner* — Laura Menz
(74) *Attorney, Agent, or Firm* — Burns & Levinson, LLP; Jerry Cohen; David Gomes

(57) ABSTRACT

A semiconductor FET provides a resonant gate and source and drain electrodes, wherein the resonant gate is electromagnetically resonant at one or more predetermined frequencies.

20 Claims, 23 Drawing Sheets

Related U.S. Application Data continuation of application No. 13/216,192, filed on Aug. 23, 2011, now Pat. No. 8,779,489.

(60) Provisional application No. 61/375,894, filed on Aug. 23, 2010.

(51) Int. Cl.

| | | |
|---|---|---|
| *H01L 23/64* | (2006.01) | |
| *H01L 25/16* | (2006.01) | |
| *H01L 49/02* | (2006.01) | |
| *H01L 29/423* | (2006.01) | |
| *H01L 29/43* | (2006.01) | |
| *H01L 29/739* | (2006.01) | |
| *H01L 29/78* | (2006.01) | |
| *G06F 1/32* | (2006.01) | |
| *H01L 23/522* | (2006.01) | |
| *H01L 23/528* | (2006.01) | |
| *H01L 23/66* | (2006.01) | |
| *H01L 29/06* | (2006.01) | |

(52) U.S. Cl.
CPC ........ *H01L 29/7831* (2013.01); *H01L 23/642* (2013.01); *H01L 2223/6627* (2013.01); *H01L 2223/6661* (2013.01); *H01L 2924/0002* (2013.01)

(56) References Cited

U.S. PATENT DOCUMENTS

| | | | |
|---|---|---|---|
| 3,590,343 A * | 6/1971 | Nathanson | H01L 27/0635 148/DIG. 53 |
| 3,796,976 A * | 3/1974 | Heng | H01P 1/10 333/161 |
| 4,630,003 A * | 12/1986 | Torizuka | H03B 5/1852 331/115 |
| 5,130,675 A * | 7/1992 | Sugawara | H03B 5/1876 331/117 D |
| 5,804,943 A * | 9/1998 | Kollman | H02M 3/3384 320/167 |
| 6,143,432 A * | 11/2000 | de Rochemont | B32B 15/00 257/E23.006 |
| 6,441,652 B1 * | 8/2002 | Qian | H03K 17/04123 327/108 |
| 6,477,065 B2 | 11/2002 | Parks | |
| 6,553,646 B1 * | 4/2003 | de Rochemont | H01L 39/143 228/248.1 |
| 6,731,248 B2 | 5/2004 | Killen | |
| 7,002,436 B2 | 2/2006 | Ma | |
| 7,092,840 B2 | 8/2006 | Gualtieri | |
| 7,268,099 B1 * | 9/2007 | de Rochemont | H01L 39/143 174/251 |
| 7,405,698 B2 * | 7/2008 | de Rochemont | H01Q 1/362 343/700 MS |
| 7,405,898 B2 | 7/2008 | de Rochemont | |
| 7,579,618 B2 * | 8/2009 | Adam | B82Y 10/00 257/12 |
| 7,652,901 B2 | 1/2010 | Kirchmeier | |
| 7,763,917 B2 * | 7/2010 | de Rochemont | C23C 18/1212 136/244 |
| 8,178,457 B2 * | 5/2012 | de Rochemont | H01Q 1/362 501/134 |
| 8,350,657 B2 | 1/2013 | de Rochemont | |
| 8,542,509 B2 | 9/2013 | Sagneri | |
| 8,552,708 B2 | 10/2013 | de Rochemont | |
| 8,593,819 B2 | 11/2013 | de Rochemont | |
| 8,624,337 B2 | 1/2014 | Weinstein | |
| 8,715,839 B2 | 5/2014 | de Rochemont | |
| 8,749,054 B2 * | 6/2014 | de Rochemont | H01L 23/642 257/14 |
| 8,779,489 B2 * | 7/2014 | de Rochemont | H01L 23/64 257/296 |
| 8,922,347 B1 * | 12/2014 | de Rochemont | H01Q 9/26 340/10.4 |
| 8,952,858 B2 | 2/2015 | de Rochemont | |
| 9,123,768 B2 * | 9/2015 | de Rochemont | B82Y 10/00 |
| 9,153,532 B2 * | 10/2015 | de Rochemont | H01L 23/64 |
| 9,348,365 B2 | 5/2016 | de Rochemont | |
| 9,348,385 B2 * | 5/2016 | de Rochemont | G06F 1/3203 |
| 9,490,414 B2 | 11/2016 | de Rochemont | |
| 9,710,181 B2 * | 7/2017 | de Rochemont | G06F 3/0625 |
| 9,735,148 B2 * | 8/2017 | de Rochemont | H01L 27/0629 |
| 2002/0110004 A1 * | 8/2002 | Parks | H02M 3/1588 363/21.06 |
| 2004/0001024 A1 * | 1/2004 | Killen | H01Q 9/0442 343/792.5 |
| 2005/0036269 A1 * | 2/2005 | Ma | B81B 7/0077 361/301.1 |
| 2005/0192774 A1 * | 9/2005 | Gualtieri | G01D 3/036 702/150 |
| 2006/0086994 A1 * | 4/2006 | Viefers | B82Y 10/00 257/415 |
| 2006/0092079 A1 * | 5/2006 | de Rochemont | H01Q 1/362 343/700 MS |
| 2006/0197076 A1 * | 9/2006 | Adam | B82Y 10/00 257/25 |
| 2007/0003781 A1 * | 1/2007 | de Rochemont | B82Y 30/00 428/615 |
| 2007/0139976 A1 * | 6/2007 | de Rochemont | B82Y 30/00 363/17 |
| 2009/0011922 A1 * | 1/2009 | de Rochemont | H01Q 1/362 501/137 |
| 2009/0015314 A1 * | 1/2009 | Kirchmeier | H01S 3/097 327/424 |
| 2011/0024812 A1 * | 2/2011 | Weinstein | H03B 5/30 257/296 |
| 2011/0049394 A1 * | 3/2011 | de Rochemont | A01N 59/16 250/493.1 |
| 2011/0248900 A1 * | 10/2011 | de Rochemont | H01Q 9/26 343/803 |
| 2011/0316612 A1 * | 12/2011 | de Rochemont | H01L 23/642 327/524 |
| 2012/0043598 A1 * | 2/2012 | de Rochemont | H01L 23/64 257/300 |
| 2012/0098509 A1 * | 4/2012 | de Rochemont | H01F 17/062 323/282 |
| 2012/0104358 A1 * | 5/2012 | de Rochemont | B82Y 10/00 257/14 |
| 2012/0217938 A1 * | 8/2012 | Sagneri | H02M 3/158 323/205 |
| 2012/0275123 A1 * | 11/2012 | de Rochemont | H01Q 1/362 361/748 |
| 2013/0061605 A1 * | 3/2013 | de Rochemont | B64D 15/12 62/3.5 |
| 2014/0013129 A1 * | 1/2014 | de Rochemont | G06F 1/3203 713/300 |
| 2014/0013132 A1 * | 1/2014 | de Rochemont | G06F 1/3203 713/320 |
| 2015/0097221 A1 * | 4/2015 | de Rochemont | H01L 23/64 257/296 |
| 2016/0225759 A1 * | 8/2016 | de Rochemont | H01L 23/64 |
| 2016/0260705 A1 * | 9/2016 | Ikimura | H01L 29/7835 |
| 2017/0139624 A1 * | 5/2017 | de Rochemont | G06F 13/42 |

FOREIGN PATENT DOCUMENTS

| | | | | |
|---|---|---|---|---|
| WO | WO 2006039699 A2 * | 4/2006 | | H01Q 1/362 |
| WO | WO 2012027412 A1 * | 3/2012 | | H01L 23/64 |

OTHER PUBLICATIONS

Office Action issued in corresponding Chinese Patent Application No. 201180051637, dated Feb. 8, 2017.

* cited by examiner

POWER FET WITH A RESONANT TRANSISTOR GATE

CROSS REFERENCE TO RELATED APPLICATIONS

This application claims priority from U.S. Provisional Patent application 61/375,894 entitled "FULLY INTEGRATED HIGH POWER SILICON CHIP CARRIER" filed Aug. 23, 2010.

FIELD OF THE INVENTION

The present invention relates specifically to the integration of passive circuit elements within an elongated gate of a field effect transistor ("FET") that cause the gate to be resonant at a pre-determined frequency, or band of desirable frequencies, used to switch current loads through the device. The present invention relates generally to the integration of resonant transistor gates within the power FET of a fully integrated power management module, or within circuitry that is part of a semiconductor carrier used to manage data transfer between additional semiconductor die electrically connected through its surface.

BACKGROUND OF THE INVENTION

The power FET has become a limiting component in many power management circuits used to regulate voltage and/or current in DC-DC converters, AC-DC inverters, or AC transformers. In recent decades, significant efforts have been made to boost the power FET's output currents and switching speeds to keep pace with the integrated circuit "transistor shrinks". The smaller transistors increase system switching speeds and the transistor densities within an integrated circuit. Higher densities allow vastly more transistors to be incorporated into a single semiconductor chip, causing it to require larger operational currents. Similarly, smaller transistor dimensions also increase operational system speeds. Any inability to supply a combination of larger currents at higher switching speeds leaves many systems "under powered". This is particularly the case in multi-core microprocessors where the inability to supply required current at suitably higher speed impairs reliable data transfer with external memory circuits. As a result of this deficiency, processor cores will typically operate at 25%-30% utilization rates. This problem becomes more acute when processor cores are configured in parallel. For instance, a 16 core microprocessor array will function slower than a 4 core microprocessor array due to in adequate power refresh cycling. Therefore, it is desirable to increase power efficiencies by developing power FETs that enable arbitrarily high currents to be switched at arbitrarily high switching speeds. While higher switching speed and current levels are of specific benefit to power FETs, methods that enable switching speeds above 400 MHz or over a distinct band of frequencies could be usefully applied to many other FET applications. Therefore, generalized methods to tune a FET's switching speed and/or current output is also desirable.

Co-location of high efficiency switched-mode power management devices with one or more processor cells also reduces the overall system power losses through much shorter interconnect circuitry. Methods and apparatus that improve the efficiency of supplied power to a processor core by co-locating power management in immediate proximity to computational die are therefore enabling and desirable to the enhanced utilization of microprocessor arrays and the improved operational efficiency of high-speed computational systems.

Most approaches to increase power FET switching speeds have focused on reducing the transistor gate capacitance. This is done generally by making the gate electrode smaller, and by using more sophisticated electronic doping configurations within the transistor junction. A significant drawback to these elements of the prior art is the generation of larger quantities of heat, which is undesirable and must be properly managed to safeguard the performance of neighboring semiconductor devices. While smaller gate structures lower capacitance, they also increase current densities flowing through the transistor junction to attain high currents, which, in-turn, increases generated heat to levels that prevent co-location of power management in close proximity to computational semiconductor die. Higher current levels often require thermal management mechanisms to be added to the system to drain the excess heat generated by the higher levels of resistive loss. Additional or more sophisticated thermal management requirements increase the cost and design complexity of the overall system. Prior art solutions advance improved doping topologies to reduce the ON-resistance of the power FET's transistor junction. However, the proposed solutions alone do not reduce ON-resistance to sufficiently low levels that allow power management systems to be monolithically integrated with or placed in close proximity to the active system devices, or to mitigate or eliminate thermal management devices from the power management system. This is a particular problem in power management systems that are assembled from discrete components. Therefore, it is also desirable to reduce the ON-resistance of a power FET by orders of magnitude to levels that mitigate or eliminate thermal management systems in a power management device.

Many power management systems are utilized in mobile platforms that are subject to frequent or unpredictable mechanical shock. Solder joints are used to electrically interconnect surface mounted passive components (resistors, capacitors, inductors) on a printed circuit board in electrical communication with one or more semiconductor die. Lead-free solders used to achieve modern environmental standards do not have the mechanical integrity of the lead-based solders they are replacing. Fractures in solder joints are the dominant cause for field failures in mobile systems. Additionally, solder joint failures in power management devices are the leading cause for grounding aircraft due to unscheduled maintenance. Therefore, methods that eliminate solder joints from a power management system by monolithically integrating all components on to a semiconductor die are also beneficial and a desirable objective of the present invention.

1. Description of the Prior Art

Yoshimochi, U.S. Pat. No. 7,459,749 B2, entitled HIGH SPEED POWER MOSFET, applies a low resistance layer to a gate structure buried within a channel to increase the power FET's switching speed.

Disney and Grabowski, U.S. Pat. No. 7,115,958 B2, entitled LATERAL POWER MOSFET FOR HIGH SWITCHING SPEEDS, instructs the use of field plates within a gate structure of a lateral field effect transistor to improve the propagation of gate signals within high voltage power transistors.

Saito and Omura, U.S. Pat. No. 6,967,374 B1, entitled POWER SEMICONDUCTOR DEVICE, instructs methods to reduce the ON resistance of a power switching element through the use of power MOSFETs electrically connected in parallel with Schottky barrier diodes to achieve a "soft-switching" operational mode, wherein they disclose various embodiments of MOSFET superjunction doping configurations.

Parker and Tanghe, U.S. Pat. No. 6,630,715 B2, entitled ASYMMETRICAL MOSFET LAYOUT FOR HIGH-CURRENT AND HIGH SPEED OPERATION, uses multiple metallization layers that overlay a source electrode on top of a drain and gate electrodes to modulate a surface FET at higher currents and speeds, and in particular disclose metallization layouts that minimize capacitive coupling and maximize current flows that mitigate failure modes due to electromigration.

Parks, U.S. Pat. No. 6,477,065 B2, entitled RESONANT GATE DRIVER, discloses the use of a resonant circuit to drive the gate of one or more vertical field effect transistors.

Calafut, U.S. Pat. No. 6,396,102 B1, entitled FIELD COUPLED POWER MOSFET BUS ARCHITECTURE USING TRENCH TECHNOLOGY, discloses the application of multiple gate trenches within the gate signal buses of a power MOSFET to suppress hot-carrier generation improve the voltage handling ability of the gate signal bus.

Hshieh and So, U.S. Pat. No. 6,025,230, entitled HIGH SPEED MOSFET POWER DEVICE WITH ENHANCED RUGGEDNESS FABRICATED BY SIMPLIFIED PROCESSES, disclose manufacturing methods and electronic doping patterns that enable a vertical power FET to operate at higher switching speed by reducing gate capacitance.

Sakamoto and Yoshida, U.S. Pat. No. 5,903,034, entitled SEMICONDUCTOR CIRCUIT DEVICE HAVING AN INSULATED-GATE TYPE TRANSISTOR, instruct the use of resistive, capacitive and reactive (transistor/diode) elements to reduce the parasitic capacitance within a control circuit that modulates a power FET when the two systems are embedded in the same semiconductor die.

Meyer et al., U.S. Pat. No. 5,665,618, entitled METHOD OF FORMING AN INTERBAND LATERAL RESONANT TUNNELING TRANSISTOR WITH SINGLE NARROW GATE ELECTRODE, discloses a quantum-effect device that utilizes resonant tunneling process in narrow-gap nanostructures to form a lateral transistor on a quantum wire.

Dansky et al., U.S. Pat. No. 5,287,016, entitled HIGH SPEED BIPOLAR FIELD EFFECT TRANSISTOR (BI-FET) CIRCUIT, uses multiple transistors and complementary clocks to achieve higher switching speeds with reduced power dissipation.

Ballga and Schlect, U.S. Pat. No. 4,967,243, entitled POWER TRANSISTOR STRUCTURE HIGH SPEED INTEGRAL ANTIPARALLEL SCHOTTKY DIODE, incorporates an integral Schottky diode in anti-parallel connection with the transistor to improve recovery characteristics and prevent forward voltage overshoot transients by conducting reverse currents through the device.

Nathanson et al., U.S. Pat. No. 3,590,343, entitled RESONANT GATE TRANSISTOR WITH FIXED POSITION ELECTRICALLY FLOATING GATE ELECTRODE IN ADDITION TO RESONANT MEMBER, utilizes a vibrating member, such as a cantilever, to control current modulation in a transistor gate by means of mechanical resonance.

Abele et al., U.S. patent application Ser. No. 12/850,126, entitled MICRORESONATOR, discloses the application of a micromechanical resonator within the gate of a transistor.

Weinstein and Bhave, U.S. patent application Ser. No. 12/811,552, entitled RESONANT BODY TRANSISTOR AND OSCILLATOR, disclose methods that couple a resonant body, or cavity that may or may not be filled with a dielectric material, with an inversion and/or an accumulation gate, to create transistor functionality.

Disney and Hsing, U.S. patent application Ser. No. 12/576,150, entitled POWER DEVICES WITH SUPERJUNCTIONS AND ASSOCIATED METHODS MANUFACTURING, disclose manufacturing methods to form vertical power FETs that contain "superjunctions" to reduce the device ON-resistance.

Gao et al., U.S. patent application Ser. No. 12/549,190, entitled SUPER JUNCTION TRENCH POWER MOSFET DEVICE FABRICATION, disclose methods to manufacture superjunction power FETs with reduced ON-resistance and improved breakdown voltages to improve device efficiency.

Masuda and Mori, U.S. patent application Ser. No. 12/127,782, entitled RESONANT CIRCUIT WITH FREQUENCY TUNABILITY, disclose integration of capacitors and inductors in a semiconductor chip to form resonant circuits that control signals that modulate one or more transconductance devices, such as an amplifier or a gyrator, co-located in the semiconductor chip.

2. Definition of Terms

The term "active component" is herein understood to refer to its conventional definition as an element of an electrical circuit that that does require electrical power to operate and is capable of producing power gain.

The term "amorphous material" is herein understood to mean a material that does not comprise a periodic lattice of atomic elements, or lacks mid-range (over distances of 10's of nanometers) to long-range crystalline order (over distances of 100's of nanometers).

The term "bucket" is herein understood to refer to a bank of transistors on an integrated circuit ("IC") that tuned to provide the desired functional performance at a specific subset of signal parameters (voltage, frequency, etc.) that fall within the overall range of signal tolerances the IC is designed to operate within.

The terms "chemical complexity", "compositional complexity", "chemically complex", or "compositionally complex" are herein understood to refer to a material, such as a metal or superalloy, compound semiconductor, or ceramic that consists of three (3) or more elements from the periodic table.

The term "chip carrier" is herein understood to refer to an interconnect structure built into a semiconductor substrate that contains wiring elements and active components that route electrical signals between one or more integrated circuits mounted on chip carrier's surface and a larger electrical system that they may be connected to.

The term "DDMOSFET" herein references its conventional meaning as a double-diffused dopant profile in conjunction with a field-effect transistor that uses a metal-oxide-semiconductor interface to modulate currents.

The terms "discrete assembly" or "discretely assembled" is herein understood to mean the serial construction of an embodiment through the assembly of a plurality of pre-fabricated components that individually comprise a discrete element of the final assembly.

The term "electroceramic" is herein understood to mean its conventional definition as being a complex ceramic material that has robust dielectric properties that augment the field densities of applied electrical or magnetic stimulus.

The term "emf" is herein understood to mean its conventional definition as being an electromotive force.

The term "EMI" is herein understood to mean its conventional definition as electromagnetic interference.

The term "FET" is herein understood to refer to its generally accepted definition of a field effect transistor wherein a voltage applied to an insulated gate electrode induces an electrical field through insulator that is used to modulate a current between a source electrode and a drain electrode.

The term "IGBT" herein references its conventional meaning as an insulated gate bipolar transistor.

The term "integrated circuit" is herein understood to mean a semiconductor chip into which a large, very large, or ultra-large number of transistor elements have been embedded.

The term "LCD" for Liquid Chemical Deposition is herein understood to mean a method that uses liquid precursor solutions to fabricate materials of arbitrary compositional or chemical complexity as an amorphous laminate or free-standing body or as a crystalline laminate or free-standing body that has atomic-scale chemical uniformity and a microstructure that is controllable down to nanoscale dimensions.

The term "liquid precursor solution" is herein understood to mean a solution of hydrocarbon molecules that also contains soluble metalorganic compounds that may or may not be organic acid salts of the hydrocarbon molecules into which they are dissolved.

The term "microstructure" is herein understood to define the elemental composition and physical size of crystalline grains forming a material substance.

The term "MISFET" is herein understood to mean its conventional definition by referencing a metal-insulator-semiconductor field effect transistor.

The term "mismatched materials" is herein understood to define two materials that have dissimilar crystalline lattice structure, or lattice constants that differ by 5% or more, and/or thermal coefficients of expansion that differ by 10% or more.

The term "MOSFET" is herein understood to mean its conventional definition by referencing a metal-oxide-silicon field effect transistor.

The term "nanoscale" is herein understood to define physical dimensions measured in lengths ranging from 1 nanometer (nm) to 100's of nanometers (nm).

The term "power FET" is herein understood to refer to the generally accepted definition for a large signal vertically configured MOSFET and covers multi-channel (MUCH-FET), V-groove MOSFET, truncated V-groove MOSFET, double-diffusion DMOSFET, superjunction, heterojunction FET or HETFET, and insulated-gate bipolar transistors (IGBT).

The term "surface FET", also known as "lateral FET", is herein understood to understood by its conventional definition as a field effect transistor that uses electrodes applied to, and electronic dopant profiles patterned on the surface of and within a semiconductor layer to modulate current flows across the surface of the semiconductor layer.

The term "standard operating temperatures" is herein understood to mean the range of temperatures between −40° C. and +125° C.

The terms "tight tolerance" or "critical tolerance" are herein understood to mean a performance value, such as a capacitance, inductance, or resistance that varies less than ±1% from the rated design value over standard operating temperatures.

In view of the above discussion, it would be beneficial to improve the performance of a power FET, or any FET, by allowing it modulate arbitrarily high current levels at arbitrarily high switching speeds, or to achieve efficient operation at any switching frequency or band of frequencies. The present invention instructs methods to fabricate a resonant transistor gate and its monolithic integration into a low-loss high-power, high-speed switched-mode power management module or a semiconductor carrier to improve the operational efficiency of co-located semiconductor die, including graphical processor units (GPU) or central processor units (CPU) or memory units, in electrical communication with the power management module or fully integrated semiconductor carrier.

SUMMARY OF THE INVENTION

The present invention generally relates to methods to tune the switching speed and/or boost the current output of a power FET, or any other FET, as well as the monolithic integration of a resonant transistor gate within a power management module or a semiconductor chip carrier that have passive components integrated onto their surfaces that operate within critical tolerance, and in particular to the construction of a resonant transistor gate containing passive circuit elements, specifically tight-tolerance passive circuit elements, embedded within the gate structure that are electrically connected in various way to form a lumped RLC circuit or distributed network that is resonant at a particular frequency or band of frequencies.

An embodiment of the present invention provides a semiconductor FET, comprising a resonant gate and source and drain electrodes, wherein the resonant gate is electromagnetically resonant at one or more predetermined frequencies. The resonant gate may include integrally constructed reactive components connected in series or parallel with resonant gate segments. The reactive components may include ceramic dielectric material. The dielectric material may have dielectric properties that vary ≤±1% over temperatures in the range of −40° C. to +120° C.

The FET may further comprise a plurality of embedded capacitive circuit elements electrically connected in series with one or more resonant gate segments to form a lumped capacitance that reduces overall input capacitance of the resonant gate. The resonant gate may have adjacently located segments which reactively couple to each other. The FET may further comprise dielectric material integrally constructed to affect the reactive coupling between adjacently located segments of the resonant gate.

The resonant gate may form an elongated resonant transmission line. The FET may further comprise reactive and resistive components integrally constructed within the resonant gate to form the elongated resonant transmission line in combination with segments of the resonant gate, which elongated transmission line is resonant at one or more predetermined frequencies. The resistive component may be located to terminate the resonant transmission line. One or more resistive components within the resonant gate may be adapted to control bandwidth of the resonant gate.

The gate electrode may have a gate width to gate length ratio≥100. The gate width to gate length ratio may be greater than either one thousand, ten thousand, one hundred thousand or one million to one.

The resonant gate may be constructed to have a serpentine path. The serpentine path may induce electromagnetic coupling between adjacent segments of the resonant gate. The inductive reactive loads may be formed along adjacent resonant gate segments having parallel instantaneous current vector alignment. Capacitive reactive loads may be formed along adjacent resonant gate segments having anti-parallel instantaneous current vector alignment. The serpentine path may obey a fractal geometry.

The FET may further comprise a power management module integrated in a monolithic structure with the FET. The integrated FET and monolithic power management module may be formed on silicon, silicon germanium, or a III-V compound semiconductor. The FET may be a DDMOS, superjunction or IGBT vertical FET, or a surface FET.

A power management module may comprise the FET described above. Resonant frequencies of the resonant gate may correspond to switching frequencies used in the power management module. A silicon carrier may comprise the FET described above.

BRIEF DESCRIPTION OF THE DRAWINGS

The present invention is illustratively shown and described in reference to the accompanying drawings, in which.

DESCRIPTION OF THE PREFERRED EMBODIMENT

Figure 1A:
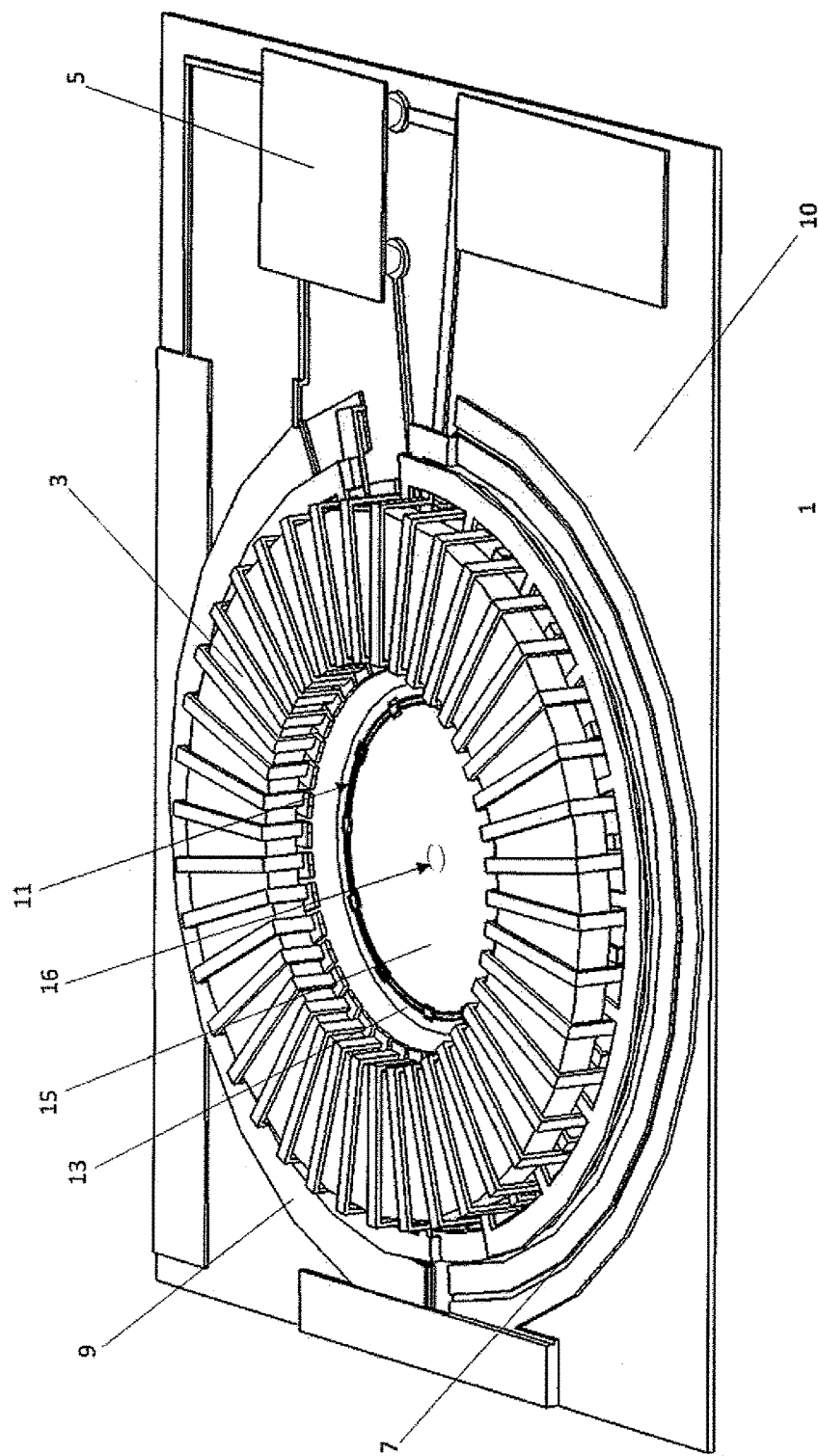
FIGS. 1A,1B,1C,1D illustrate the physical design of a monolithic power management module modulated by a resonant gate surface FET having dielectric passive components embedded within the resonant gate used to form an RLC circuit and a schematic for the RLC circuit depicted in the physical models.

This application is copending with de Rochemont U.S. Ser. No. 13/168,922, entitled SEMICONDUCTOR CARRIER WITH VERTICAL PET POWER MODULE, filed Jun. 24, 2011 (de Rochemont '922), and de Rochemont U.S. Ser. No. 13/163,654, entitled FREQUENCY-SELECTIVE DIPOLE ANTENNA, filed Jun. 17, 2011 (de Rochemont '654), which are incorporated herein by reference. The current application instructs the incorporation of passive components and/or high dielectric density electroceramic elements within transistor gate structures to cause a power FET to become resonant at a desired frequency or range of desired frequencies. One counterpart application (de Rochemont '922) instructs means to fully integrate a high efficiency, power management system as a monolithic structure on a semiconductor carrier to modulate high current levels using a resonant three-dimensional gate structure enabled by serpentine windings. The other counterpart application, (de Rochemont '654), instructs methods to form a conducting element as a serpentine winding by folding the conducting element in ways that introduce localized regions of capacitive or inductive loading, such that the combination of localized reactive loads along the length of the folded conductor form a distributed network filter. It goes on to illustrate how two mirror image serpentine elements so formed function as a dipole antenna that is resonant over selective frequencies. The counterpart application de Rochemont '654 also instructs the insertion of tight-tolerance electroceramic material within the regions of localized reactive loading to increase or more precisely tune the coupling strength of localized reactive loads. The current application is also copending with de Rochemont U.S. provisional application No. 61/409,846, QUANTUM DOT FIELD EFFECT TRANSISTOR IN A FULLY INTEGRATED SILICON CARRIER AND METHOD OF MANUFACTURE THEREOF, filed Nov. 3, 2010 (de Rochemont '846), which is incorporated herein by reference.

The current application incorporates by reference all matter contained in de Rochemont, U.S. patent application Ser. No. 11/479,159, filed Jun. 30, 2006, entitled ELECTRICAL COMPONENT AND METHOD OF MANUFACTURE (the '159 application), de Rochemont, U.S. patent application Ser. No. 11/620,042 filed Jan. 6, 2007 entitled POWER MANAGEMENT MODULES (the '042 application, de Rochemont and Kovacs, U.S. patent application Ser. No. 12/843,112 filed Jul. 26, 2010, LIQUID CHEMICAL DEPOSITION PROCESS APPARATUS AND EMBODIMENTS, (the '112 application), and de Rochemont U.S. patent application Ser. No. 13/152,222, entitled MONOLITHIC DC/DC POWER MANAGEMENT MODULE WITH SURFACE FET, filed Jun. 2, 2011 (the '222 application). The '159 application discloses how LCD methods fabricate a monolithic integrated circuit comprising tight tolerance passive networks. The '042 application discloses how liquid chemical deposition ("LCD") methods fabricate a monolithic integrated power management module that includes a tunable inductor coil. The '112 application discloses preferred apparatus used in applying LCD methods. The '222 application instructs the monolithic integration of a low-loss power management circuit containing a surface FET.

The present invention applies LCD manufacturing methods to integrate tight-tolerance passive circuit elements within the gate structure of a field effect transistor to produce a resonant gate signal response at a desired frequency or band of frequencies. The modulation of large currents typically requires large gate structures that increase gate capacitance, which, in turn, decreases switching speed. Large gate structures can be switched at higher speeds by applying more energy to the gate to displace the charge that collects underneath it. However, the displacement of large quantities of electrical charge under a large gate will require more energy to be applied to the gate electrode than is passed from the source to the drain to achieve the switching speeds desired in many modern microelectronic applications. This paradox results in negative efficiency devices. It is a specific objective of the present invention to modulate FET power output at arbitrarily high frequencies (switching speeds) in FETs having arbitrarily large gate structures. It is an additional objective to produce high-speed/high-current power management devices by embedding resistive, capacitive and inductive elements to form an RLC circuit within the gate enable the transistor gate to be operated under conditions of "gate resonance". At gate resonance the switching response is effortless because the embedded inductance neutralizes the reactance of the gate and any embedded capacitors. As discussed further below, the passive circuit elements embedded within the gate structure are used to tune the gate's resonant frequency response to match any desired switching speed or band of switching frequencies regardless of the gate's surface area and internal capacitance. This resonant frequency response is achieved by embedding tight-tolerance, high-density dielectric materials that precisely tune the performance values of the embedded passive circuit elements located at select locations within the gate structure. The resonant transistor gate thereby allows power FET to manage arbitrarily large currents, limited only by the resistance and patterning of the conductors within in the device. The shape and elemental chemistry of the device conductor elements should selected to minimize resistive loss and electromigration to ensure reliable operation.

LCD manufacturing methods allow compositionally complex and mismatched materials having atomic-scale chemical uniformity and stoichiometric precision to be integrated in selected areas on the surface of a semiconductor substrate. The process temperatures (≤400° C.) used by LCD do not alter dopant profiles of active components buried within the semiconductor substrate. These low deposition temperatures also allow the microstructure of LCD deposits to be restricted to nanoscale dimensions. Nanoscale microstructural controls are a necessary condition for producing electroceramic compositions that have functional properties that remain stable with varying temperature. These combined attributes allow complex electroceramics to be formed into higher performance passive components that hold the critical performance tolerances needed to make passive circuit integration economically viable. LCD manufacturing technology enables monolithic integration of passive components by ensuring their operational performance values are held to within ±1% of their desired performance over standard operating temperatures without disturbing active circuitry embedded within a semiconductor substrate.

The invention relates primarily to the formation of a resonant transistor gate structure fabricated by placing electroceramics as a passive component or a dielectric element on the surface of a semiconductor. The invention is not dependent on a particular doping structure within the semiconductor substrate and can be applied to any and all currently known FET junction doping patterns or any contemplated power FET doping structures without limitation to marginal gains that might be achieved by one doping profile relative to another when applied to a specific application.

Figure 1B:
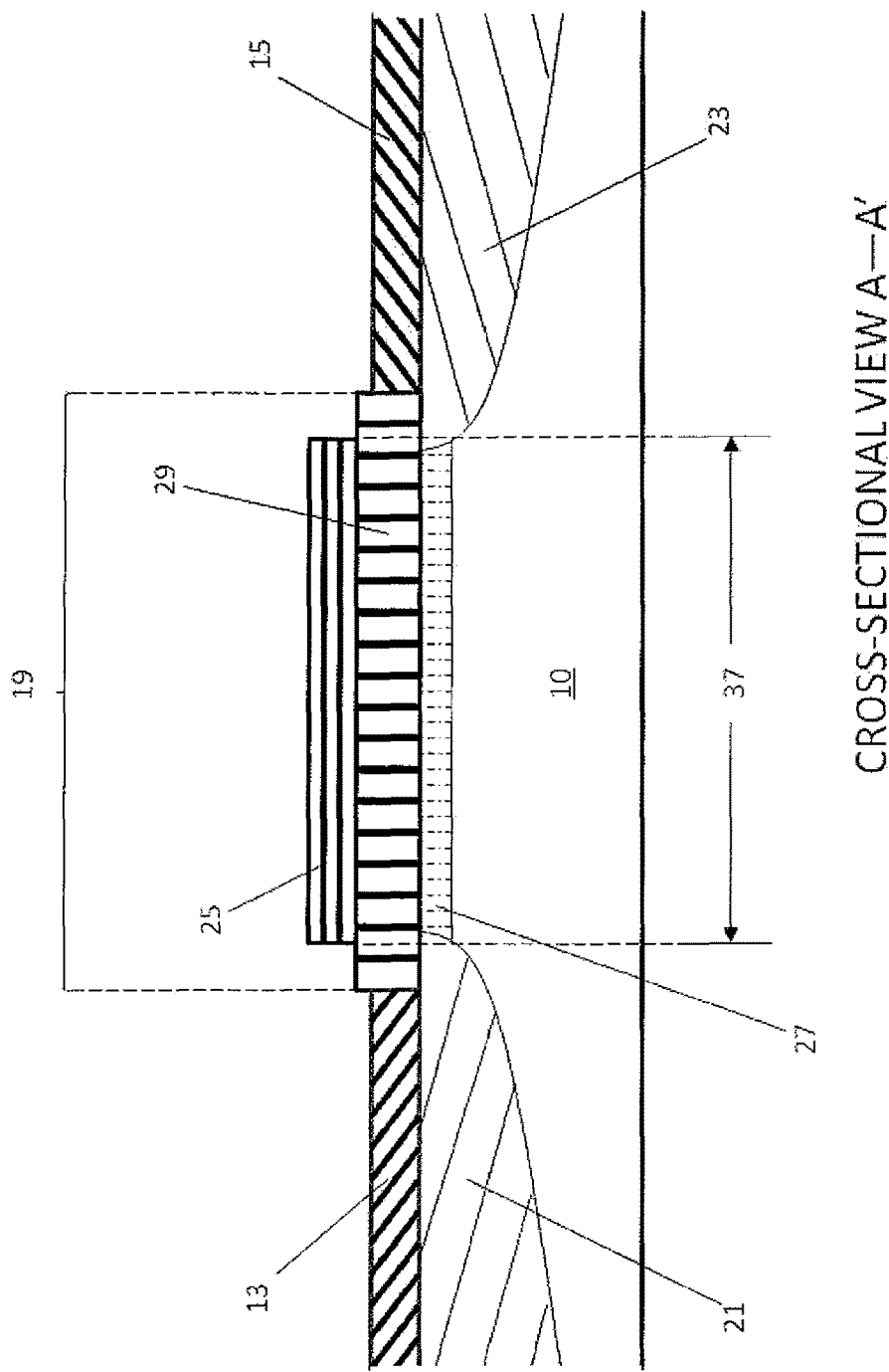
Figure 1C:
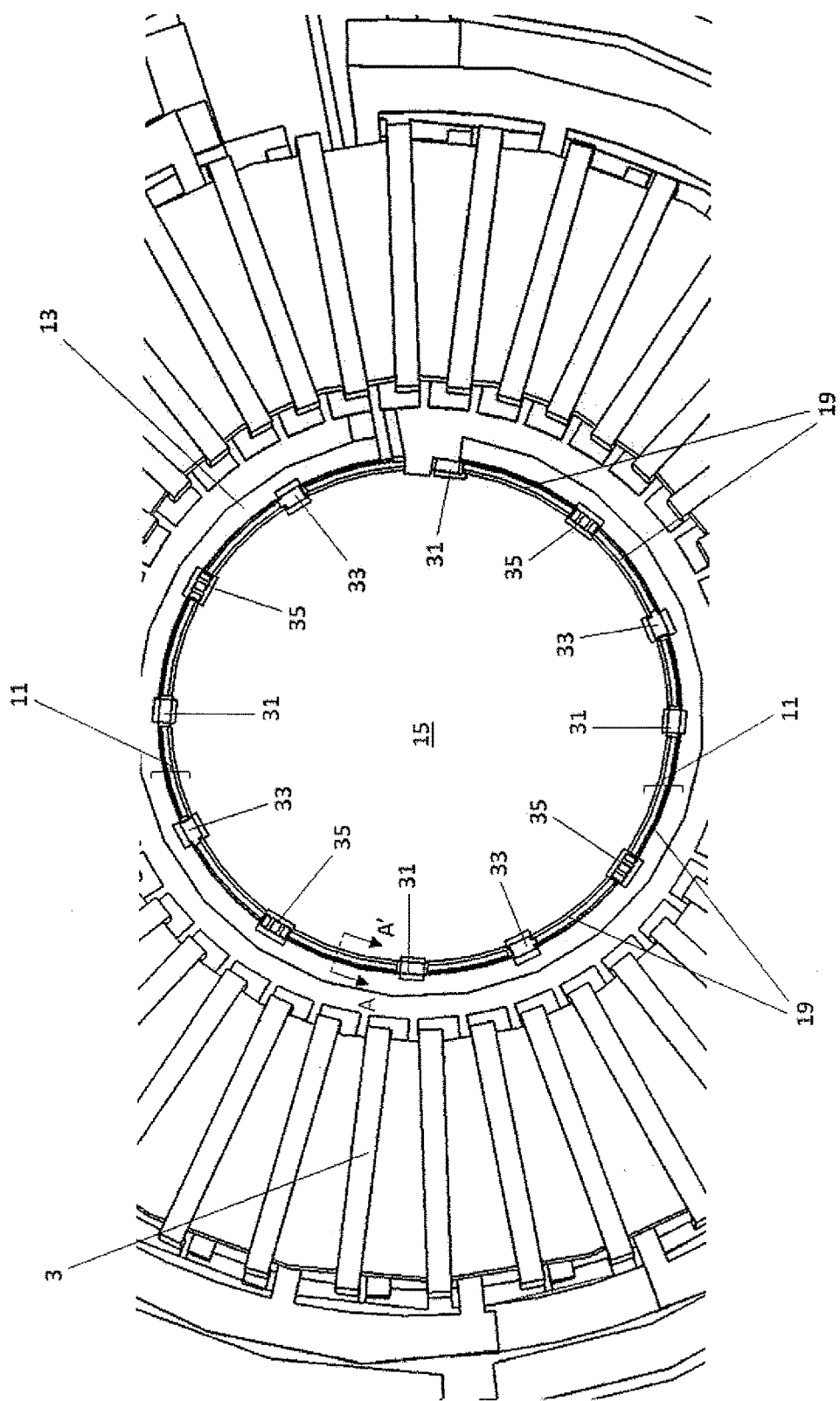
Figure 1D:
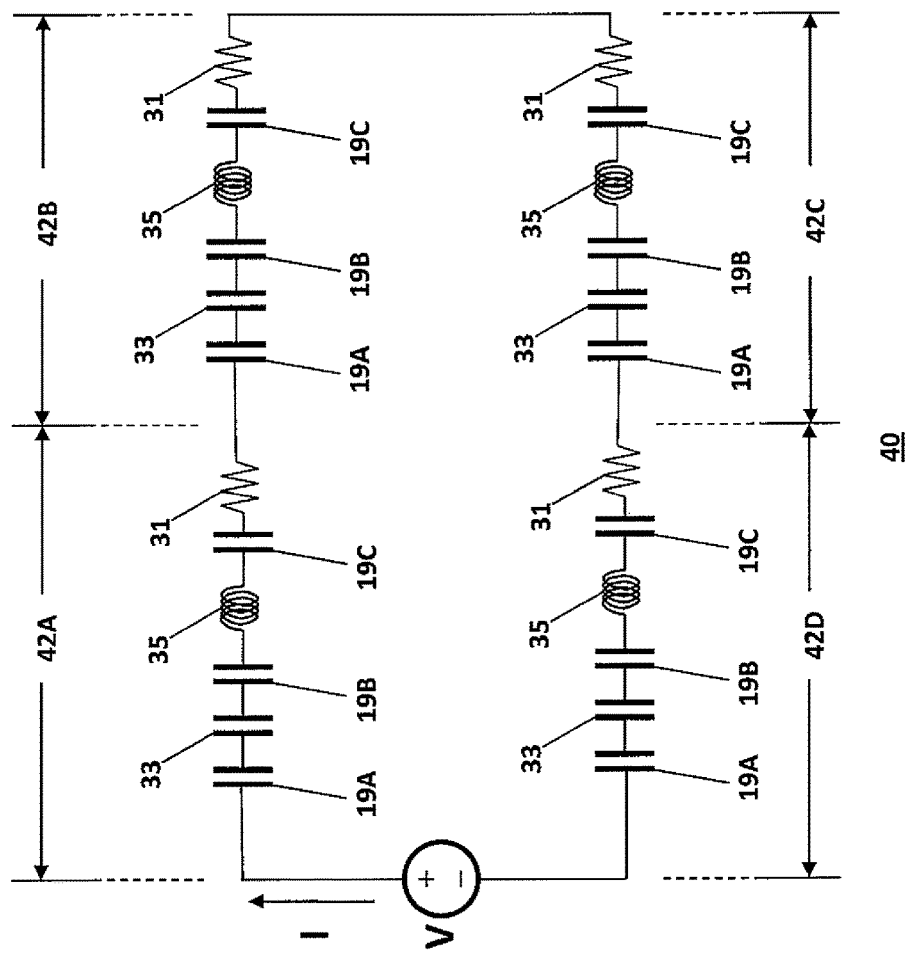

Reference is now made to FIGS. 1A,1B,1C,1D & 2A,2B, 2C to illustrate the principal embodiments of the invention. FIGS. 1A,1B,1C depict a monolithic power management module 1 that consists of a toroidal inductor or transformer coil 3, a controller circuit 5, a embedded diode 7 and an output capacitor 9 formed on the surface of a p-type semiconductor 10 using similar methods to those described in the '222 application. In this particular instance, a resonant gate surface FET 11 modulates current flow between the source electrode 13 and the drain electrode 15. The source electrode is in electrical communication with the transformer coil 3. The drain electrode 15 contacts electrical ground on the backside of the p-type semiconductor 10 through a thru via 16. The resonant gate surface FET 11 is produced by forming surface gate structure segments 19 between and above n-type source 21 and drain 23 diffusion regions embedded within the p-type semiconductor 10 upon which the monolithic structure is formed. Voltage applied to the gate electrode 25 forms a conductive channel 27 in the p-type semiconductor 10 immediately below the gate insulator 29, which allows current to pass between the n-type source 21 and drain 23 diffusion regions. LCD methods are used to embed passive components comprising one or more embedded resistor elements 31, embedded capacitor elements 33, and embedded inductor elements 35 that are introduced between surface gate structure segments 19. Although depicted in series connection, the embedded passive components may be formed in series and/or in parallel with one another with the surface gate structure segments 19 as needed by a given design. The embedded passive components (31,33,35) in combination the surface gate structure segments 19 are used to transform the gate into a resonant transmission line. The gate signal frequency response is tuned by selecting a combination of passive component (31,33,35) values using RLC lumped circuit or distributed network filter techniques to cause the gate signal to be resonant at a desired frequency or range of frequencies. Surface gate structure segments 19 that modulate current between the source 13 and drain 15 electrodes, such as that shown in A-A' cross-section in FIG. 1B, are treated as capacitive elements in the lumped RLC circuit analysis. FIG. 1D provides a circuit schematic of the resonant gate surface FET 11 illustrated in FIG. 1C to show how the gate structure segments 19A,19B,19C and the various embedded passive components (31,33,35) form a transmission line 40 when they are electrically interconnected in series. The resonant transmission line 40 may consist of one or more resonant transmission line segments 42A,42B,42C,42D that are in turn electrically connected in series. As discussed in greater detail below, the resonant characteristics can be more simply derived using closed equations if gate structure segment 19C is omitted from the circuit, and circuit elements 19A,19B&33 are reduced to a single lumped capacitor.

The resonant gate surface FET 11 need not be formed using a series-connected resonant transmission line 40 as shown in FIG. 1D. As illustrated in greater detail below, resonant transmission lines can also be formed by connecting various embedded passive components (31,33,35) in parallel. Such connections would be made by placing one electrode of the various embedded passive components (31,33,35) in electrical contact with source electrode 13 or each other, with the remaining electrode making electrical contact with a gate structure segment 19. It is herein understood that present invention covers all possible configurations that electrically connect embedded passive components (31,33,35) in series or in parallel that form a resonant transmission line or resonant transmission line segment.

Figure 2A:
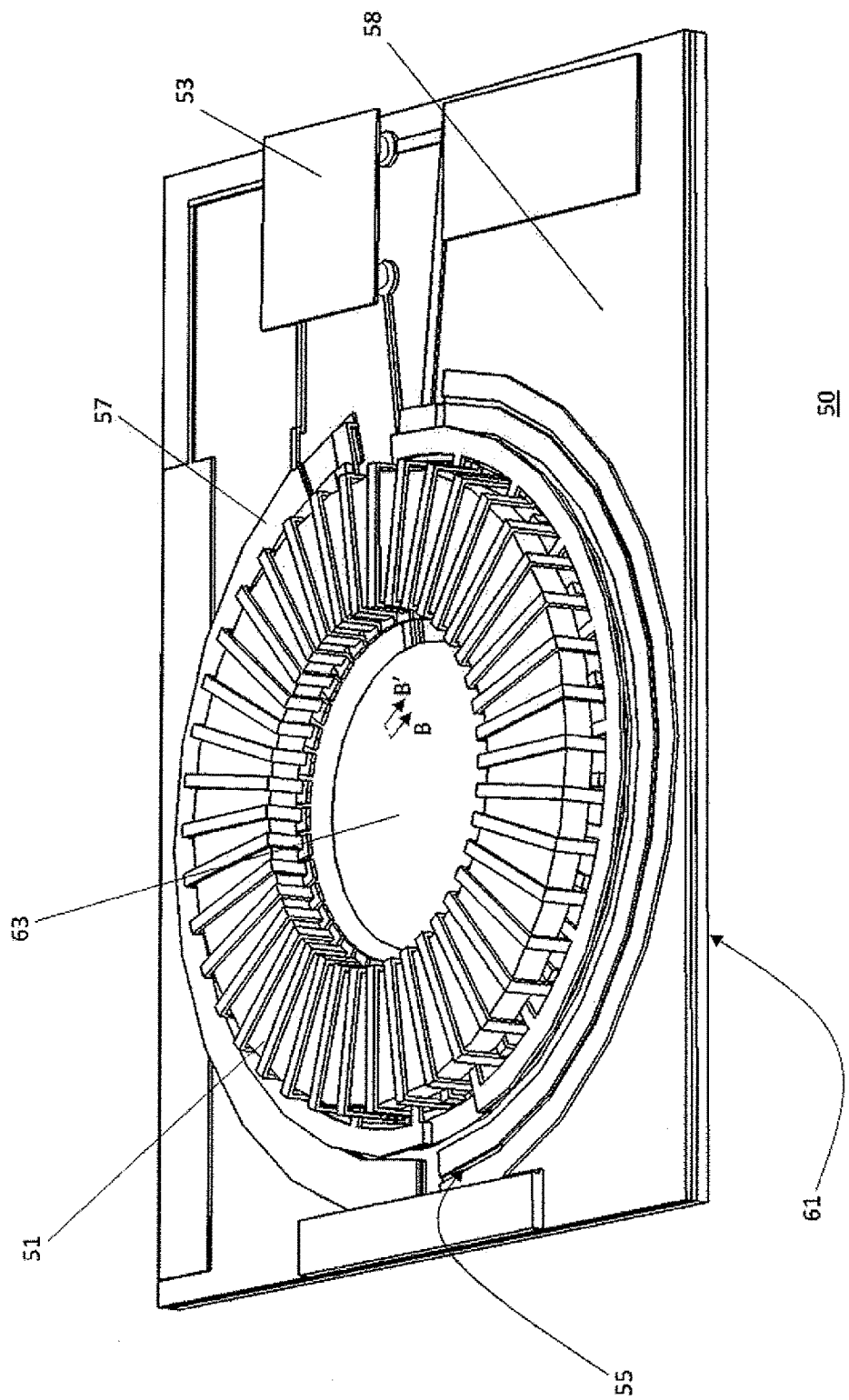
FIGS. 2A,2B,2C illustrate the physical design of a monolithic power management module modulated by a resonant gate surface FET having dielectric passive components embedded within the resonant gate to form an RLC circuit.
Figure 2B:
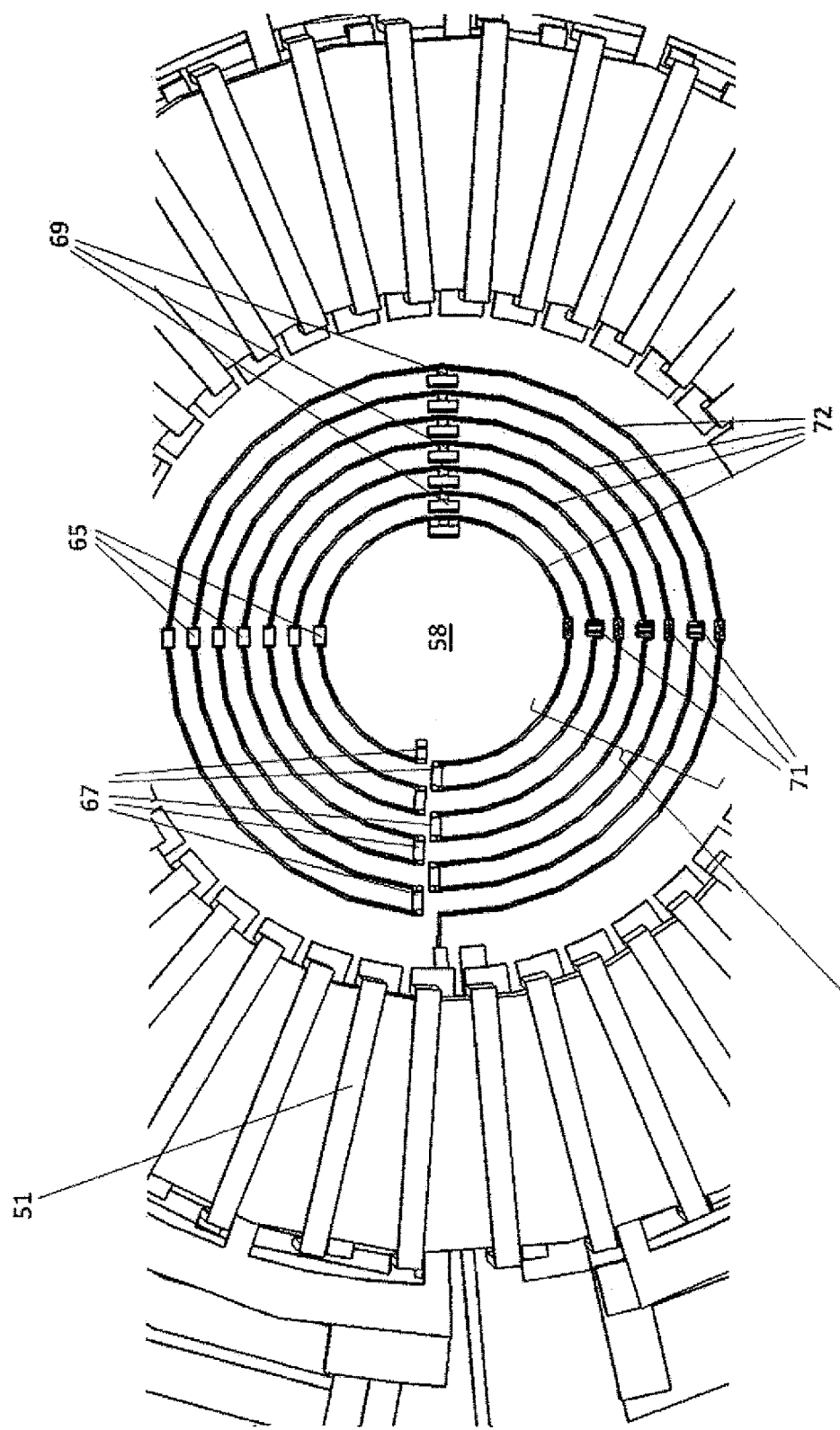
Figure 2C:
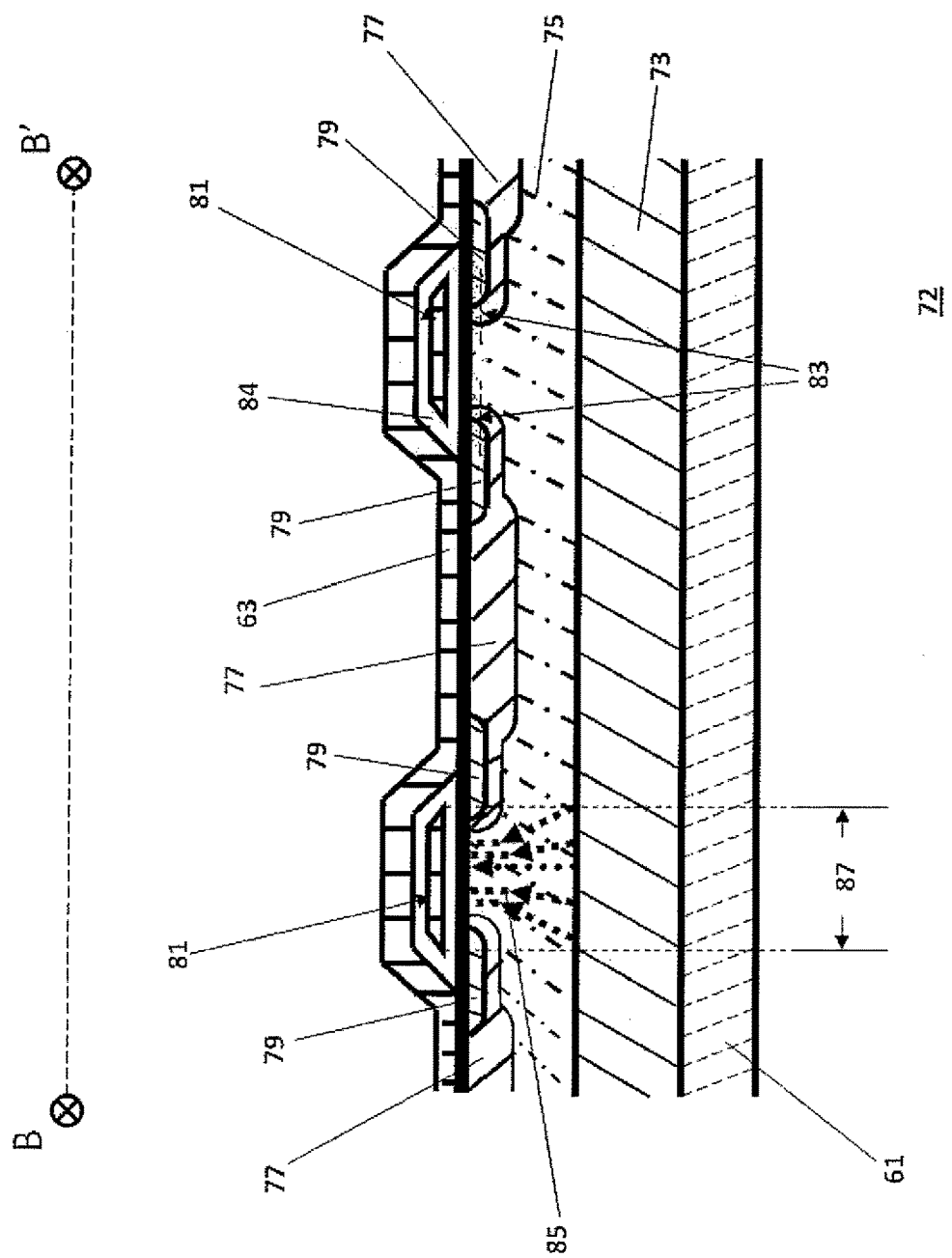

FIGS. 2A,2B,2C depict an alternative monolithic power management module 50 that consists of a toroidal inductor or transformer coil 51, a controller circuit 53, an embedded diode 55 and an output capacitor 57 formed on an electronically patterned multilayer semiconductor 58 using methods similar to those described in de Rochemont '922. In this instance, a resonant gate vertical FET 59, located beneath and insulated from the source electrode 63 modulates current flow between a drain electrode 61 and the source electrode 63. The source electrode 63 is in electrical communication with the transformer coil 51. FIG. 2B depicts a close-up top view of the resonant gate vertical FET 59 with the source electrode 63 removed for illustrative clarity. The resonant gate vertical FET 59 is formed by inserting passive components (resistors 65, capacitors 67, 69, and/or inductors 71) between vertical gate structure segments 72. Vertical gate structure segments 72 are shown in cross-sectional view B-B' in FIG. 2C. All elements of the resonant gate vertical FET 59 are electrically insulated from the source electrode 63 by an amorphous silica encapsulant, (not shown for illustrative clarity), unless a ground contact to a passive component is called for as discussed below. The vertical gate structure segment 72 may also be placed between multiple parallel source electrodes in configurations where the source electrode 63 does not overlay the gate structure (not shown).

In general, a vertical FET consists of a drain electrode 61, a drain layer 73 comprising a highly doped semiconductor material, (usually doped with charge carrier densities in the range of $10^{18}$ to $>10^{19}$ cm$^{-3}$), and a lightly doped (usually n-type) intrinsic semiconductor layer 75 having charge carrier density in the range of $10^{10}$ to $<10^{17}$ cm$^{-3}$ depending upon the semiconductor material and design considerations. The intrinsic semiconductor layer 75 will be selectively doped with opposite type (usually p-type) dopants in barrier diffusion regions 77 to produce active junctions. The diffusion regions 77 may be trenched or take the form of pillars used to form a superjunction (not shown) as design alternatives. Similarly, the drain layer 73 may be n-type to form a conventional double-diffused junction (DDMOSFET) or may be p-type to form an insulated gate bipolar transistor (IGBT). Source diffusion regions 79 (usually n$^+$-type with charge carrier density>$10^{17}$ cm$^{-3}$) are formed to establish ohmic contact with the source electrode 63. Voltage applied to the gate electrode 81 forms a conductive channel 83 within the barrier diffusion regions 77 immediately below the gate insulator 84 of the gate structure segment 72 to modulate current flow 85 between the source electrode 63 and drain layer 73.

In a resonant gate vertical FET 59, LCD methods are used to insert passive components comprising one or more resistor elements 65, capacitor elements 67,69, and inductor elements 71 at select locations between the vertical gate structure segments 72. Performance values of the passive components and their electrical interconnection, whether in series or in parallel, are selected using methods of RLC lumped circuit or distributed network filter analysis to cause the gate to operate as a resonant transmission line having frequency response optimized ("resonant") at a desired frequency or band of frequencies. Vertical gate structure segments 72 that modulate current between the source electrode 63 and drain layer 73, such as that shown in B-B' cross-section in FIG. 2C, are treated as capacitive elements in the lumped RLC circuit/distributed network analysis. The vertical gate structure segments 72 and the inserted passive components 65,67,69,71 are normally encapsulated with an insulating material, preferably amorphous silica insulator, which is not depicted in the figures for purposes of illustrative clarity. Furthermore, although passive components 65,67,69,71 are depicted as series elements located at equal angles of arc for visual simplicity, most functional designs will require the passive components 65,67,69,71 to be configured in series and/or in parallel and spaced with the resonant gate vertical FET 59 at consistent units of arc-length. The resonant characteristics of the resonant gate vertical FET 59 would be determined using similar methods to those depicted in FIG. 1D and discussed in greater detail below.

Figure 3A:
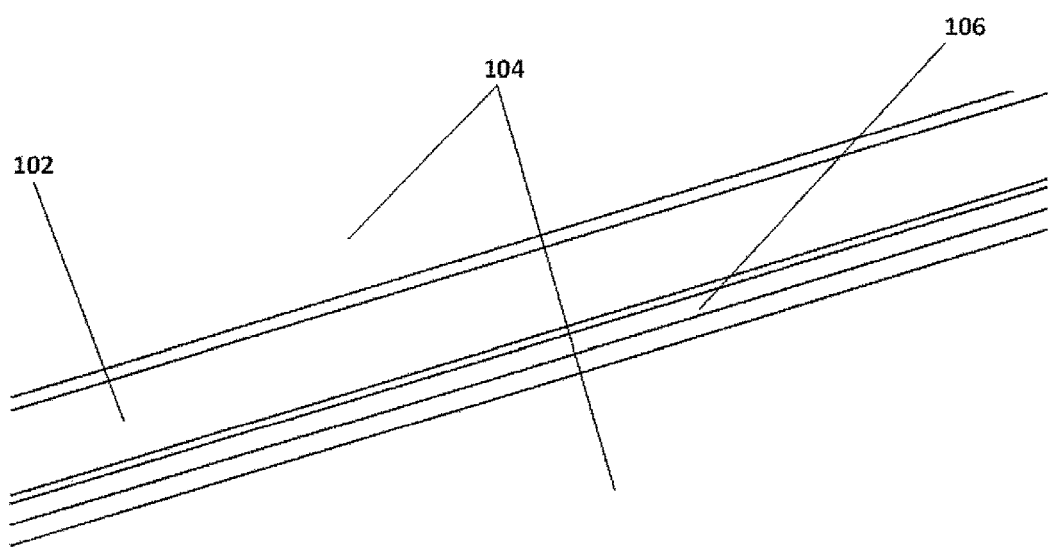
FIGS. 3A,3B,3C,3D,3E,3F,3G depict various circuit elements used to form a resonant gate transistor.
Figure 3B:
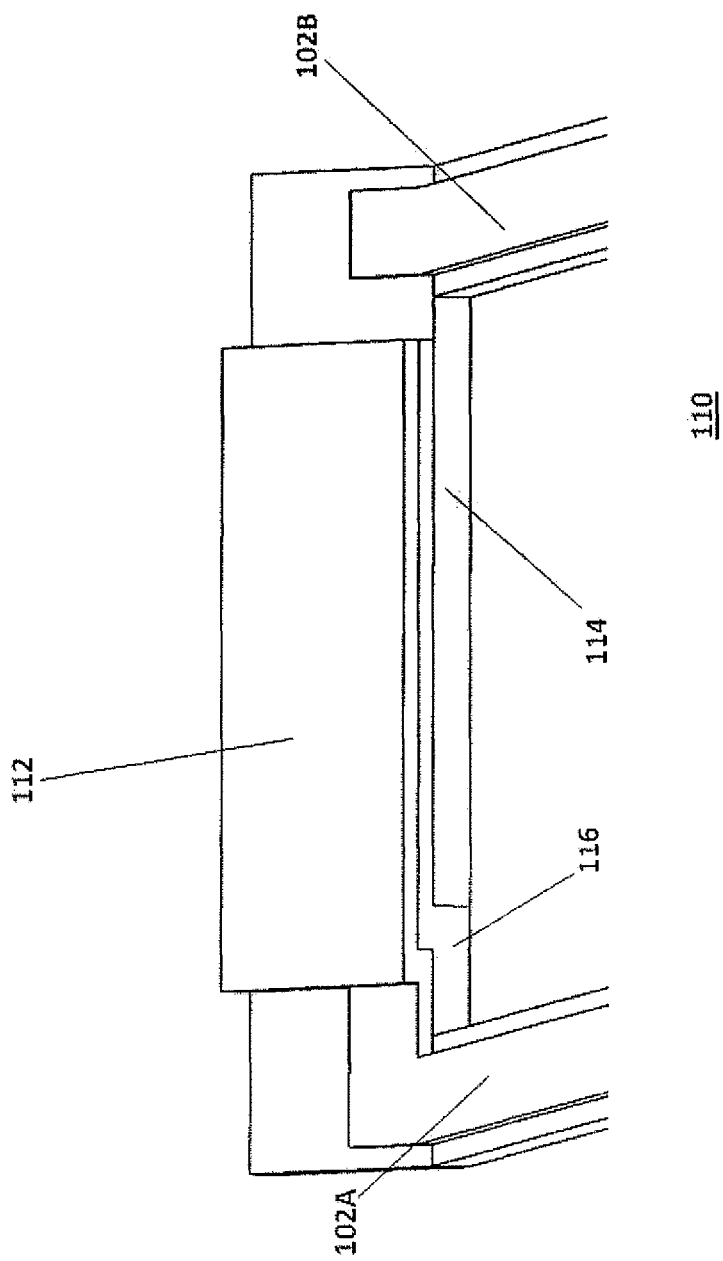
Figure 3C:
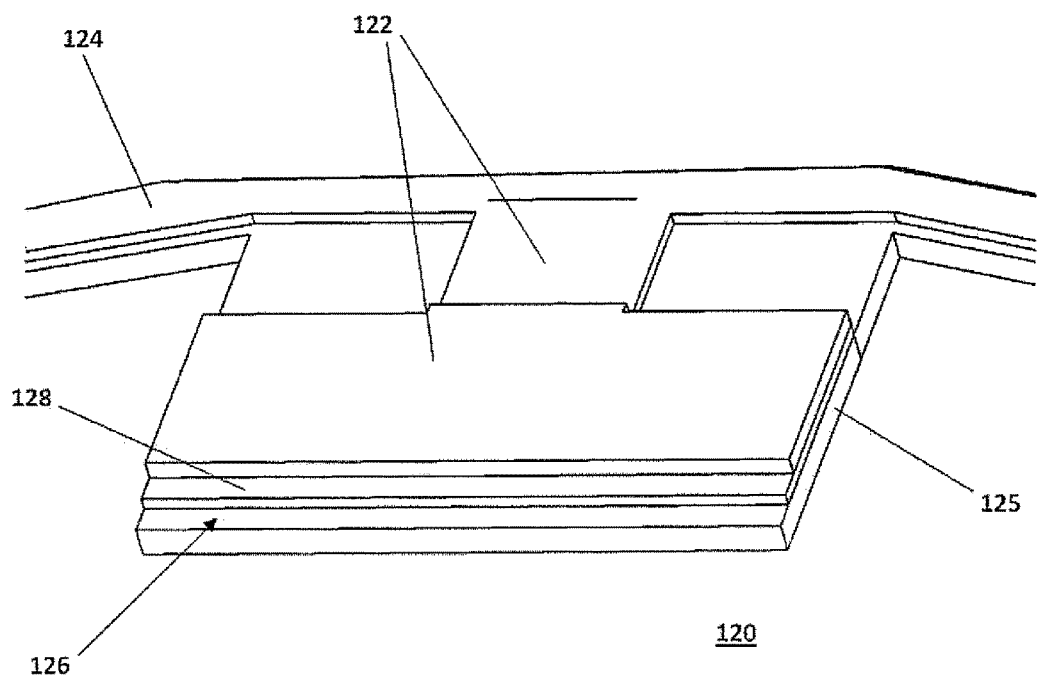
Figure 3D:
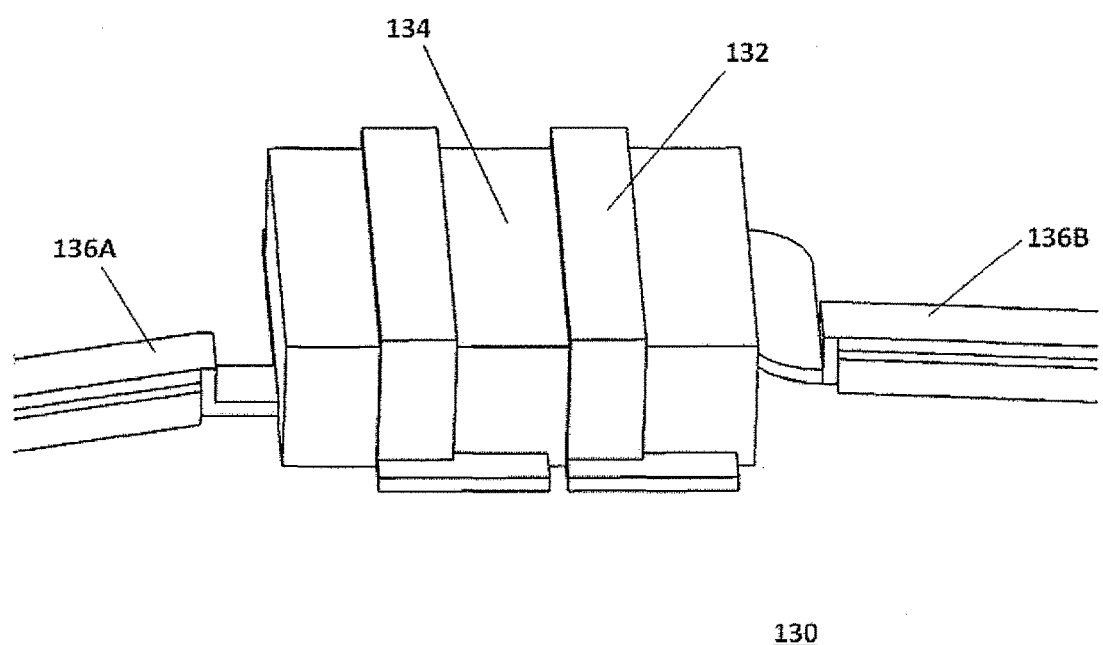
Figure 3E:
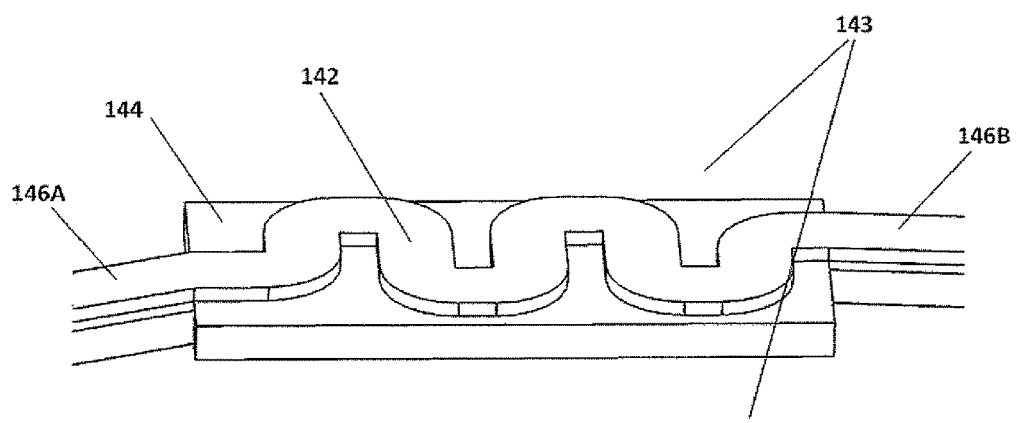
Figure 3F:
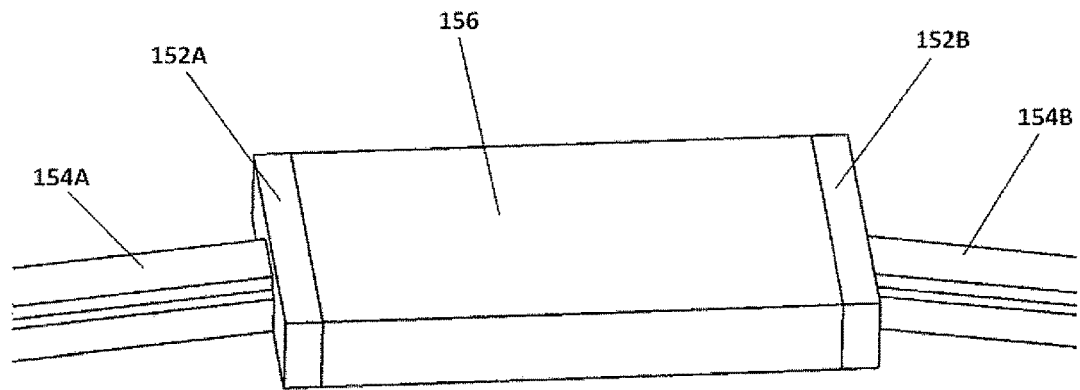

Reference is now made to FIGS. 3A-3G to better illustrate the passive components that form the resonant gate FETs 11,59. Each gate structure segment 19,72 of the resonant gate transistor is modeled as an "active" series capacitor. This is depicted in FIG. 3A, where the "active" series capacitor 100 consists of a conductive gate electrode 102 separated from the electrically patterned semiconductor surface 104, which comprises the "bottom" electrode, by a gate oxide 106. The "active" series capacitor 100 is added in series to one or more passive series capacitors 33,67. A suitable construction for an embedded series capacitor 110 is depicted in FIG. 3B. The embedded series capacitor 110 has a performance value selected to minimize the input capacitance of the resonant gate transistors 11,59 and to match other design objectives. The embedded series capacitor 110 has an upper electrode 112 that is in electrical communication with the conductive gate electrode 102A of the active series capacitor 100. The upper electrode 112 is separated from a lower electrode 114 by a tight tolerance dielectric material 116. The lower electrode 112 is in electrical communication with the conductive gate electrode 102B of the next active series capacitor 100 in resonant gate transistors 11,59 or, as the design warrants to another passive component or conducting element forming the resonant circuit. Although FIG. 2B depicts the series capacitors 67 in the resonant gate vertical FET 59 as elements that are used to electrically connect an outer circumferential portion of an arcuate gate electrode with an inner circumferential segment, any of the passive tuning elements or a portion of the active series capacitor 100 may be used to connect an outer circumferential segment with an inner circumferential segment of the resonant gate transistor.

Certain design criteria may require embedded parallel capacitors 120, (shown in FIG. 3C), to be added within the resonant gate FETs 11,59. Embedded parallel capacitors 120 are constructed by depositing a signal electrode 122 that is in electrical communication with the gate electrode 124 of an active series capacitor 100. In a resonant gate vertical FET 59, a ground electrode 125 has an exposed portion 126 that has no encapsulating dielectric (not shown) so as to be in electrical contact with the overlaid source electrode 63 that simultaneously functions as an electrical ground. The ground electrode 125 is directly connected to the source electrode in a resonant gate surface FET 11. The signal electrode 122 is separated from a ground electrode 126 by a tight tolerance dielectric material 128. Similar methods would be used to make parallel connections with resistive elements 27,65 or inductor elements 31,71 or other capacitive elements 67 embedded with the resonant gate transistors 11,59 as a particular design may require. The ground electrode 126 may optionally be in electrical communication with other elements of the resonant gate transistor 11,59.

Representative embedded inductor elements 31,71, (shown in FIGS. 3D&3E), may comprise an embedded coil 130 consisting of windings 132 wound around a magnetic core dielectric 134. Opposite ends of the windings are in electrical communication with gate electrodes 136A,136B of an active series capacitor, or other passive components or ground electrodes when connected in parallel as a specific design might warrant. Alternatively, embedded inductor elements 31,71 may comprise embedded linear or spiral inductors 140 consisting of curved conductor segments 142 deposited upon the patterned semiconductor 143. The linear or spiral embedded inductors 140 may optionally be placed on a dielectric material 144 that may or may not be a magnetic dielectric. Opposing ends of the linear or spiral inductor maintains electrical communication with the electrodes 146A,146B of an active series capacitor, or other passive components or ground electrodes when connected in parallel as a specific design might warrant.

Representative embedded resistive elements 150 (shown in FIG. 3F) will generally consist of electrodes 152A,152B in electrical communication with gate electrodes 1546A, 154B of an active series capacitor, or other passive components or ground electrodes when connected in parallel as a specific design might warrant. The electrodes 152A,152B are separated by a resistive dielectric element 156, preferably composed of a tight-tolerance resistive material.

Figure 3G:
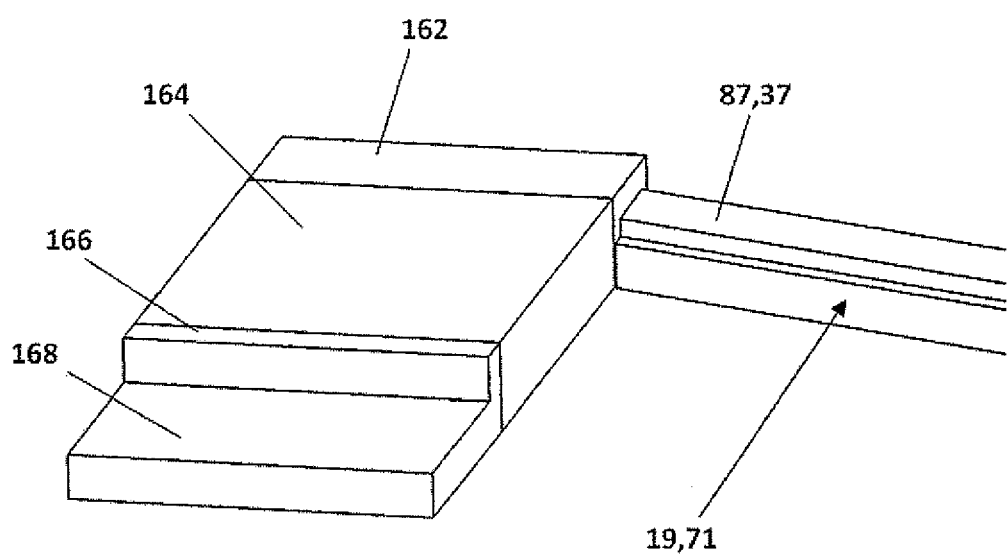

For reasons relating to the critical dampening of the transistor's resonant response discussed below, it is a preferred embodiment of the invention to configure a resistive component as an embedded terminating resistor 160 as shown in FIG. 3G. The embedded terminating resistor 160 comprises an electrode 162 that is in electrical communication with the gate electrode 37,87 of a gate structure segment 19,71 and a resistive element 164, preferably a tight tolerance electroceramic resistive element, inserted between the electrode 162 and a terminating electrode 166. As is the case with all elements of the resonant gate transistor and power management modules derived therefrom, the terminating resistor may be encapsulated by an insulator (not shown for visual clarity), preferably an amorphous silica insulator. Therefore, the terminating electrode 166 should also contain an exposed surface 168 that makes electrical contact with the overlaid source electrode 63 of a resonant gate vertical FET 59. Alternatively, the exposed surface 168 would make direct electrical contact with the source electrode 13 in a resonant gate surface FET 11 device.

It is further recommended that barrier layers (not shown) be inserted between the passive components' dielectric material and the semiconductor substrate to prevent migration of any element within the dielectric material that might readily diffuse into the semiconductor while operating the device.

"On" resistance is a critical operational parameter of all power FETs, since higher resistivity generates more heat, which, if not properly managed, will produce higher temperatures in the channel region that will degrade transistor performance. The On resistance ($R_{ON}$) of a standard vertical FET is the sum of the channel resistance ($R_{Ch}$) and the drain resistance ($R_{Drain}$) and is mathematically characterized using:

$$R_{ON} = R_{Ch} + R_{Drain} \quad (1a)$$

$$= \frac{L_{gate}}{W_{gate} C_{gate} \mu_{elec} (V_G - V_{GS(sh)})} + k \rho_{Drain} \quad (1b)$$

Where,
$L_{gate}$ is gate length,
$W_{gate}$ is the gate width,
$C_{gate}$ is the gate capacitance,
$\mu_{elec}$ is the electron mobility of the intrinsic semiconductor layer 68,
VG and VGS(sh) are the gate and short-circuited gate-source voltages, respectively,
k is a geometrical factor related to electrode geometries, and,
$\rho_{Drain}$ is resistivity of the intrinsic semiconductor layer 68 and the drain layer 69 added in series.

The gate length $L_{gate}$, when viewed in cross-section, is the width of the gate electrode 87 (37 in the case of a surface FET) as depicted in FIG. 2C (FIG. 1B). Similarly, the gate width, $W_{gate}$, would extend above and below the plane in the cross-sectional view provided in FIGS. 1B, & 2C, and is the sum total of the combined widths of all the active gate structure segments 72 (19) contained within the resonant transistor gate.

The present invention reduces $R_{ON}$ in two significant ways. An elongated gate width can be wound circumferentially within the "donut hole" of the inductor or toroidal coil 3,51. Each arcuate segment of the resonant gate vertical FET 59 wound within an outer circumferential region can be electrically connected to an interior arcuate segment. Resonant action within gate allows extreme elongated gates to be configured in this manner, so it is an aspect of the invention to have at least one, preferably more than one, circumferential loop forming the resonant gate vertical FET 59. The gate structure segments 19,72 are naturally formed over circumferential patterned doping profiles implanted or diffused into the semiconductor substrate layer.

This model representation of the present invention depicts a FET gate electrode that has a 30 μm gate length ($L_{gate}$) and a 1 meter wide gate width ($W_{gate}$) to make it easier to visualize pictorially. It could just as easily comprise an FET gate electrode that a 1 μm long (or smaller) gate length ($L_{gate}$) and a 30 meter wide (or wider) gate width ($W_{gate}$). A specific embodiment of the invention is to establish a gate electrode structure wherein the gate width ($W_{gate}$) is at least two orders of magnitude, preferably more than 6 orders of magnitude, greater than the gate length (Lgate), i.e., $10^2 \leq W_{gate}/L_{gate}$, preferably $10^6 \leq W_{gate}/L_{gate}$. Making reference to equations 1a, 1b, it is quite evident that the gate geometry described within the present invention enables a substantial reduction in "On Resistance" ($R_{ON}$) by reducing its channel resistance ($R_{Ch}$) component, which is inversely proportional to the ratio $W_{gate}/L_{gate}$. For example, a gate geometry wherein $W_{gate}/L_{gate}$ is $10^6$ will have 1 1/millionth the channel resistance of a gate electrode where $W_{gate}/L_{gate}=1$. There are corresponding reductions in the drain resistance $R_{Drain}$, since the geometrical factor, $k$, for the source electrode 63 is the ratio of the thickness of the intrinsic semiconductor layer 75 to the source electrode surface area. When there is a donut hole (not shown) at the center of the source electrode 63, its total surface area is determined as the area spanned by the outer radius minus the area spanned by the inner radius, or:

$$A = \pi(R_{out}^2 - R_{in}^2) \quad (2)$$

where, $R_{in}=0$ when there is no hole at the center. Ordinarily, the thickness of the intrinsic semiconductor layer 75 is 5 μm ($5 \times 10^{-4}$ cm) or less. When the source electrode has an outer radius on the order of 1 cm with an inner radius of 0.4 cm, the total surface area of the donut is 2.51 cm² making the geometrical factor $k = 2 \times 10^{-4}$, assuming an intrinsic semiconductor 75 layer thickness of 5 μm. In designs where the layer thickness can be reduced to 2 μm and the source electrode is expanded to 2 cm radius with no donut hole, the geometrical factor becomes $k = 1.6 \times 10^{-5}$. Consequently, the greatly expanded size of the source electrode 63 that is enabled adding greater economic value to the semiconductor real estate by fully integrating the entire system onto the semiconductor dramatically reduces the On Resistance ($R_{ON}$). The expanded source electrode, and the elongated gate widths underneath it, reduces loss in the system, thereby mitigating the need for additional system costs, such as coolant loops, to be incorporated into the larger system. The greater overall efficiency of this one fully integrated circuit lowers the cost and improves the intrinsic value of diverse systems, such as an electric motor, a radio base station, or power distribution network, in which the power management system may ultimately be applied. These concepts may also be applied to lower power systems, such as handheld wireless appliances, by shrinking the scale of the device to match the lower power requirement of those systems.

A drawback to elongated gate widths is that they will also have higher gate capacitance ($C_{gate}$). While higher gate capacitance reduces channel resistance $R_{Ch}$, the higher gate capacitance $C_{gate}$ also reduces the gate switching speed. Lower gate switching speeds are undesirable since they require larger inductance and capacitance values to be integrated into circuit, necessitating the integration of large scale components. Therefore, an additional aspect of the present invention is to integrate tight tolerance LCD passive components in series or in parallel into that gate electrode to minimize the gate input capacitance $C_{INgate}$, while maintaining elongated gate widths, $C_{gate}$. As explained in greater depth below, gate input capacitance can be minimized by adding additional capacitor elements in series with the gate electrode, which itself functions as a capacitor. The input capacitance of a transmission line is reduced when capacitors are added in series according to:

$$1/C_{gate} = \sum_{i,j} (1/C_{FETi} + 1/C_{SERIES\ CAPj}) \quad (3)$$

However, limited instantaneous bandwidth is a drawback of series capacitors, so it is desirable to add additional series capacitance elements to the gate electrode to reduce the gate's input capacitance and improve gate switching speeds.

A further aspect of the invention is to arrange the passive components, preferably tight tolerance passive components, in such a way as to cause the gate electrode to function as a critically dampened transmission line that is resonant at the desired switching speed(s) $f_{switch}$. The low loss, tight component tolerances enabled by LCD manufacturing methods allow high-Q transmission line structures to be constructed. When power management control topology uses time-based switching modes, it is preferable to tune the resonant gate electrode to have a narrow pass band. However, when control topologies utilize frequency-based switching modes, it is preferable to tune the resonant gate electrode to have a bandwidth that overlaps the frequencies of interest to the control topology.

As mentioned above, transmission lines and circuits consisting of a plurality of series capacitors will have reduced capacitance at the expense of narrower instantaneous bandwidth. Therefore, it is desirable to introduce inductor elements 35,71 within the resonant gate transistors 11,59 that cause the gate signal to have broader instantaneous bandwidth and to be resonant at the desired switching frequencies $f_{switch}$ pre-determined by the inductance of the inductor elements 35,71 and the total capacitance of the gate structure segment 19,72 and embedded capacitors 33,67,69 as defined by equation 3.

Figure 4A:
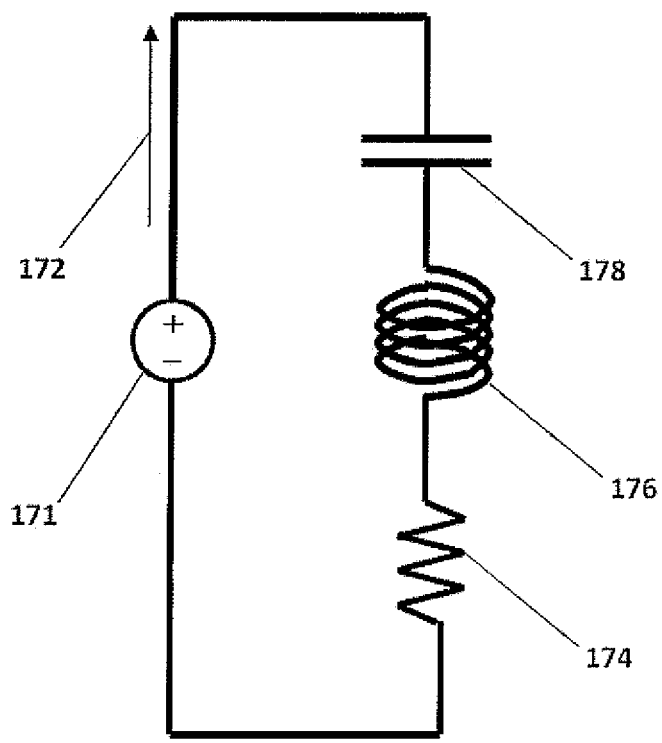
FIGS. 4A,4B provide electrical circuit schematics of RLC circuits formed using passive components configured in series and in parallel.
Figure 4B:
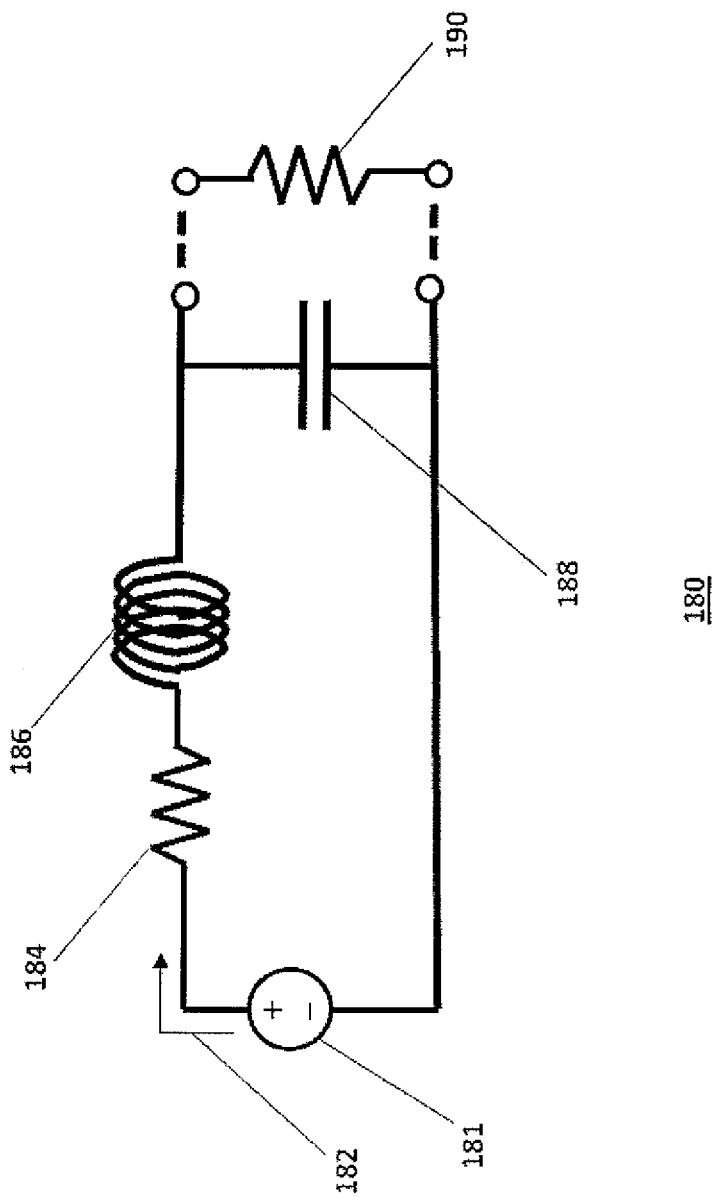

Reference is now made to FIGS. 4A,4B to illustrate resonant circuit tuning by means of embedding passive components within the transistor's resonant gate. FIG. 4A illustrates a resonant RLC circuit constructed by embedding the passive components in series. A resonant series RLC circuit 170 consists of a voltage source 171 that drives a current 172 through a resistive element 174 (R), an inductive element 176 (L), and a capacitive element 178 (C) configured in series connection. The order of the embedded passive elements 174,176,178 may vary in their sequence, and, in fact may contain a plurality of elements, such as a plurality of active series capacitors 100 and embedded series capacitors 110 in sequence with one another to reduce the gate's input capacitance in accordance with equation 3. Similarly, the passive elements 174,176,178 may be embedded in series to form a resonant series RLC circuit 170 that forms a resonant transmission line segment (42A,42B,42C, 42D) so that a plurality of resonant transmission line segments are, in turn, connected in series to form a resonant transistor gate 11,59 as depicted in FIGS. 1C&1D.

Resonant RLC circuits may also be constructed by embedding the passive circuit components in parallel as depicted in FIG. 4B. A resonant parallel RLC circuit 180 consists of a voltage source 181 that drives a current 182 through a resistive element 184 (R), an inductive element 186 (L), and a capacitive element 188 (C) configured in parallel connection. Parallel circuits may also contain a terminating resistor 190 (R). The order of the embedded passive elements 184,186,188 may vary in their sequence, and, in fact may contain a plurality of elements, such as a plurality of active series capacitors 100 and embedded parallel capacitors 120 in sequence with one another to tune the gate's capacitance. Similarly, the passive elements 184, 186,188 may be embedded in parallel to form a resonant series RLC circuit 180 that actually forms a resonant transmission line segment so that a plurality of resonant transmission line segments are, in turn, connected in series to form a resonant transistor gate 11,59.

Transmission lines and circuits that contain inductors and capacitors, in series or in parallel, will display resonant characteristics. While it is advantageous for the resultant transmission line to be resonant at the switching frequency, $f_{switch1}$, resonance can cause deleterious effects when not properly damped. The characteristic solution of an RLC circuit is expressed in terms of its natural resonant frequency, $\omega_o$, and damping factor, $\zeta$, is:

$$x = Ae^{st} \quad (4a)$$

where, $$s = -\zeta \pm \sqrt{(\zeta^2 - \omega_o^2)} \quad (4b)$$

and the circuit's natural frequency $\omega_o$ is determined by $$\omega_o = 2\pi f_o = 1/\sqrt{(LC)} \quad (4c)$$

x applies to the gate voltage when a series RLC circuit is considered and applies to the source current in the case of a parallel RLC circuit. Resistive elements, which include the conductive electrode element in the active and passive components, act as dampening force on the circuit. In parallel RLC circuits the damping coefficient is given by:

$$\zeta = 1/(2R\sqrt{(C/L)}), \quad (4d)$$

and in series RLC circuits the damping coefficient is given by:

$$\zeta = R/(2\sqrt{(L/C)}). \quad (4e)$$

It is often desirable to tune the resonant gate transistors 11,59 to be critically damped at the switching frequency to minimize settling times. Over-dampening occurs in RLC circuits when $\zeta > \omega_o$ and typically produces long settling times and large steady state errors. Under-dampening occurs when $\zeta < \omega_o$ and are prone to signal "ring", and have oscillations that decay over longer than desirable time periods. Critical dampening occurs when $\zeta = \omega_o$. Often the resistance of the conductive elements in the active and passive components forming the gate electrode is insufficient to achieve critical dampening. In these instances, it is desirable to introduce resistive elements 31,66 within the resonant gate transistors 11,59.

It is advisable to broaden the frequency bandwidth of the gate electrode when frequency-based control topologies are applied to manage power in these circuits. Bandwidth is proportional to the damping coefficient in LCR circuits and is given, in units of Hertz, by:

$$\Delta f = \Delta\omega/2\pi = \zeta/\pi = R/2\pi L. \quad (5)$$

In many instances it is desirable design objective to broaden the bandwidth by adding extra resistance to the resonant gate transistor 11,59 using a terminal resistor 160 as shown in FIG. 3G. The terminal resistor 160 is affixed to the end terminal 162 of the innermost circumferential gate structure segment 71 in a resonant gate vertical FET 59, or is used to terminate a resonant gate surface FET 11. It consists of a resistive element 164 that may be a tight tolerance dielectric material or conductive material that is in electrical contact with ground (the source electrode). In the case of a resonant gate vertical FET, the resistive element 164 is in electrical communication with a terminating electrode 166 that has a portion 168 that protrudes from any insulating material (not shown) to allow the terminating electrode 166 to make electrical contact with the overlaying source electrode 63.

The resonant gate transistors need not be constructed from simple series-only and parallel-only lumped circuits. These simple circuits allow for convenient expressions because they can be reduced to closed analytical formula. Numerical methods now provide means to determine resonant frequency response in more complex structures that contain a plurality of embedded passive components configured in series and parallel connections within a plurality of resonant transmission line segments as shown in FIG. 5C. Furthermore, at frequencies high enough for the physical structure of the resonant gate transistor 11,59 to have dimensions comparable to the gate signal's electromagnetic wavelength it may become necessary for individual resonant transmission line segments among a plurality of such segments to have varied tunings that account for transmission line delays and provide better impedance matching within the overall circuit.

Figure 5A:
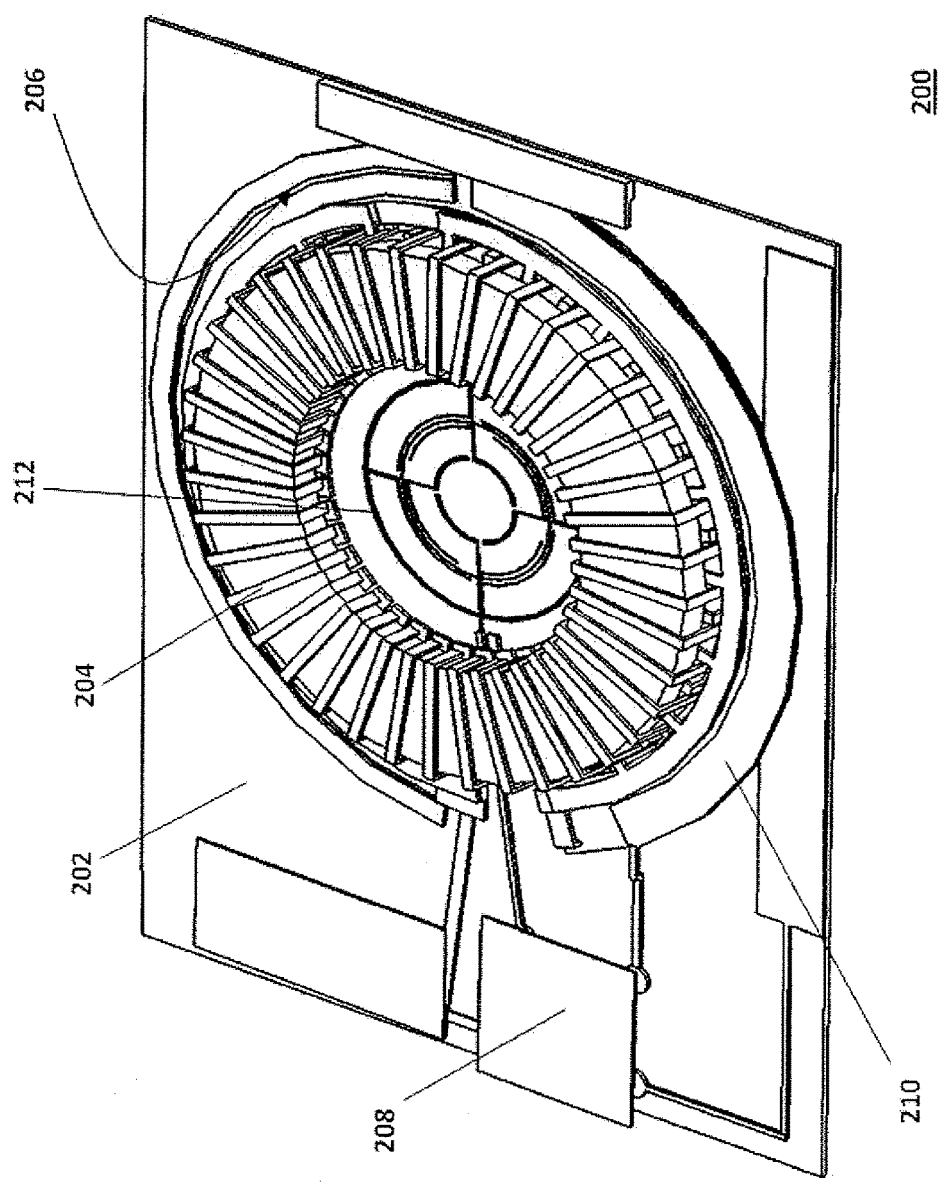
FIGS. 5A,5B,5C,5D,5E, 5F illustrate the physical design of a monolithic power management module modulated by a dielectrically loaded serpentine resonant gate transistor and a schematic for the RLC circuit depicted in the physical models.
Figure 5B:
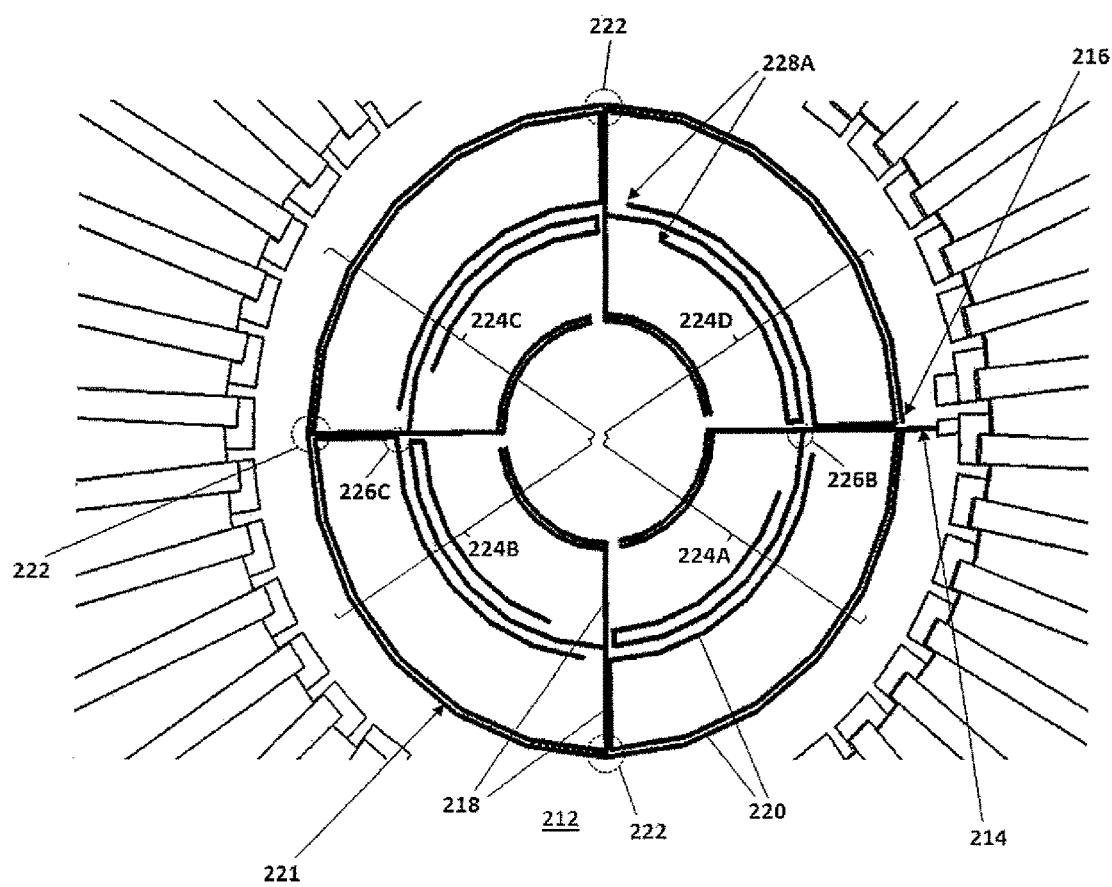
Figure 5C:
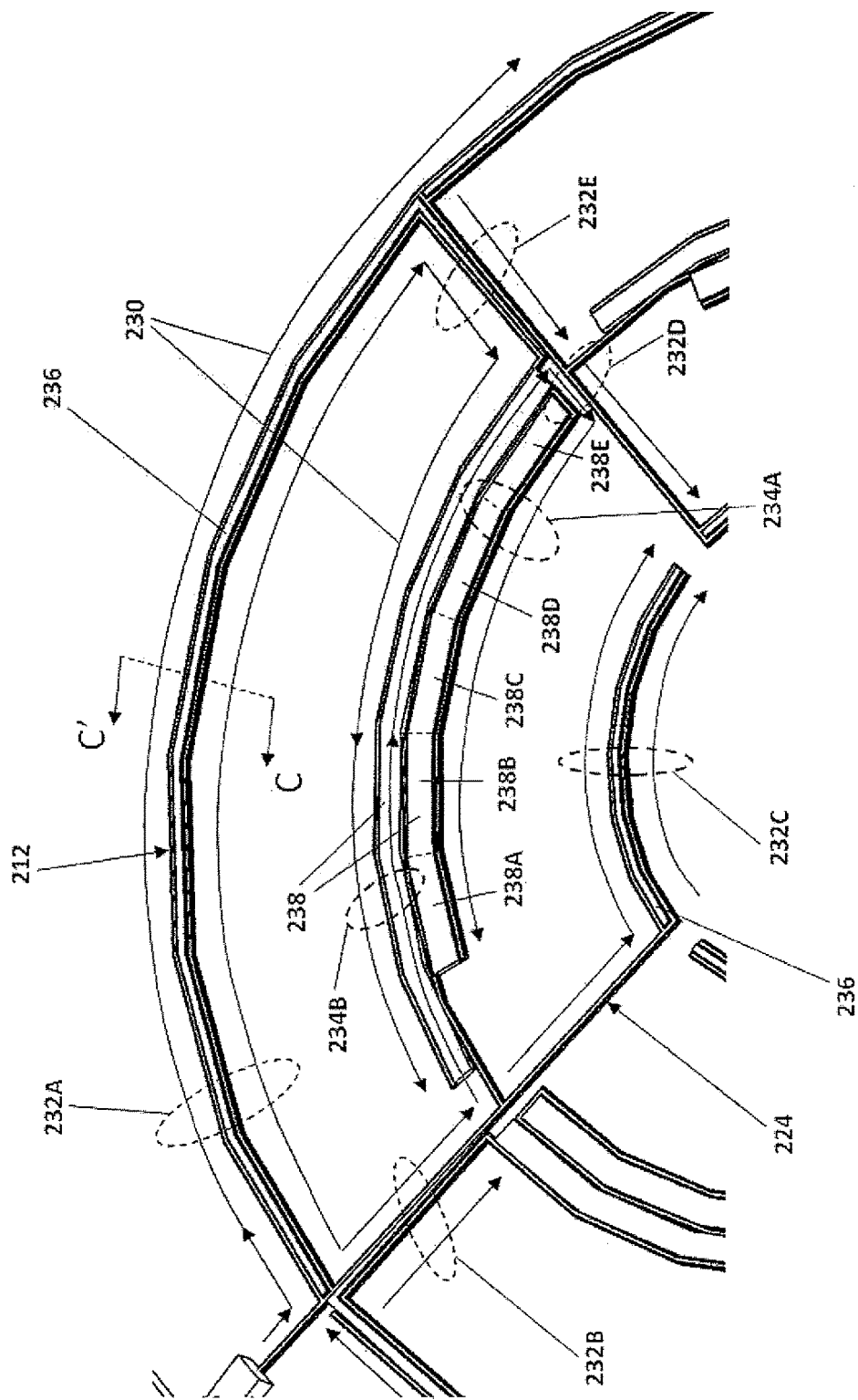

Reference is now made to FIGS. 5A-5F to illustrate an alternative resonant gate transistor that has the benefit of providing lower cost through simplified assembly techniques. This embodiment of the invention incorporates elements of copending applications de Rochemont '922 and '654. FIG. 5A depicts a perspective view of a monolithic power management module 200 formed on a semiconductor 202 that comprises a toroidal inductor coil 204, an embedded diode 206, a controller circuit 208, and an output capacitor 210. The monolithic power management module 200 is shown with its source electrode removed to reveal a dielectrically loaded serpentine resonant gate transistor 212. Although FIG. 5A depicts this embodiment applied to a vertical power FET, the principles outlined below can also be applied to a resonant gate surface using methods similar to those described above.

A close up top view of FIG. 5A is provided in FIG. 5B. The dielectrically loaded serpentine resonant gate transistor 212 is modulated by a signal supplied through a gate feed 214 and has a primary termination 216 that may comprise a terminating resistor 160. The serpentine resonant gate transistor 212 may consist of a plurality of linear gate segments 218 and/or arcuate gate segments 220 that electromagnetically couple with one another to establish resonance at a desired frequency or band of frequencies. The primary gate segment 221, (shown here as an arcuate segment that circumferentially traverses the exterior of the dielectrically loaded serpentine resonant gate transistor 212), directly connects the gate feed 214 to the primary termination 216. The primary gate segment 221 may also contain one or more major branching points 222 that split off additional gate segments 224A,224B,224C,224D to extend the serpentine gate along a different path than the primary gate segment. Each additional gate segment 224A,224B,224C,224D may have one or more additional branching points 226B,226C that in turn split-off additional serpentine gate segments, which have secondary termination points 228A that may or may not include a terminating resistor 160. As described below, the electromagnetic coupling within the serpentine paths traversed within each additional gate segment 224A, 224B,224C,224D establish the resonant characteristics of the transistor. These paths may form any imaginable path, including paths produced by the application of fractal geometries.

FIG. 5C details a preferred method of electromagnetic coupling that relies upon current vector alignment. The arrows represent instantaneous current vectors 230 of the gate signal as it flows along the branched serpentine path. Inductive reactive loading is generated along the branched serpentine path where the instantaneous current vectors 230 have parallel vector alignment 232A,232C,232D with adjacent portions of the gate within the additional gate segment 224A. Parallel vector alignments 232B,232E may also be established along portions that comprise neighboring additional gate segments 224B,224C. Capacitive reactive loading is generated along the branched serpentine path where the instantaneous current vectors 230 have anti-parallel (opposing direction) vector alignment 234A,234B within the additional gate segment 224A. Anti-parallel vector alignments (not shown) may also be established along portions that comprise neighboring additional gate segments 224B, 224C.

The inductance generated by inductive coupling between two parallel wire segments in the absence of a ground plane can be given by:

$$L_{pair} = \frac{\mu_o \mu_r l}{\pi} \left[ \frac{d}{2r} + \sqrt{\frac{d^2}{4r^2} - 1} \right] \quad (6)$$

where l is the coupling length, d is gap between the wires and r is the radius of the wire, all in meters, $\mu_o$ is the free-space permeability, and $\mu_r$ is the permeability of the material separating the parallel wires.

Similarly, the capacitance generated by capacitive coupling between two parallel wire segments in the absence of a ground plane can be given by:

$$C = l\pi \in_o \in_r \ln(d/r) \quad (7)$$

where l is the coupling length, d is gap between the wires and r is the radius of the wire, all in meters, $\in_o$ is the permittivity of free-space, and $\in_r$ is the relative permittivity of the material separating the parallel wires.

Equations 6&7 linearly correlate the strength of the reactive loading (inductive or capacitive) with the coupling length l (the physical separation of electromagnetically coupled gate segments) and the dielectric density ($\mu_r, \in_r$) of the material located between the co-linear portions of adjacent gate segments. Therefore, it is a distinct embodiment of the invention to use LCD methods to insert tight tolerance dielectric material with co-linear portions of adjacent gate segments to tune the resonant characteristics of the dielectrically loaded serpentine resonant gate transistor 212. LCD methods are used to tune the gate's resonant response by inserting high permeability dielectric loads 236, having $\mu_r \geq 10$, within the spacing between adjacent gate segments that exhibit parallel instantaneous current vector alignments 232A,232B,232C,232D,232D (where desired), and inserting high permittivity dielectric loads 238, having $\in_r \geq 10$, with the spacing between adjacent gate segments that exhibit anti-parallel instantaneous current vector alignments 234A, 234B (where desired).

Figure 5D:
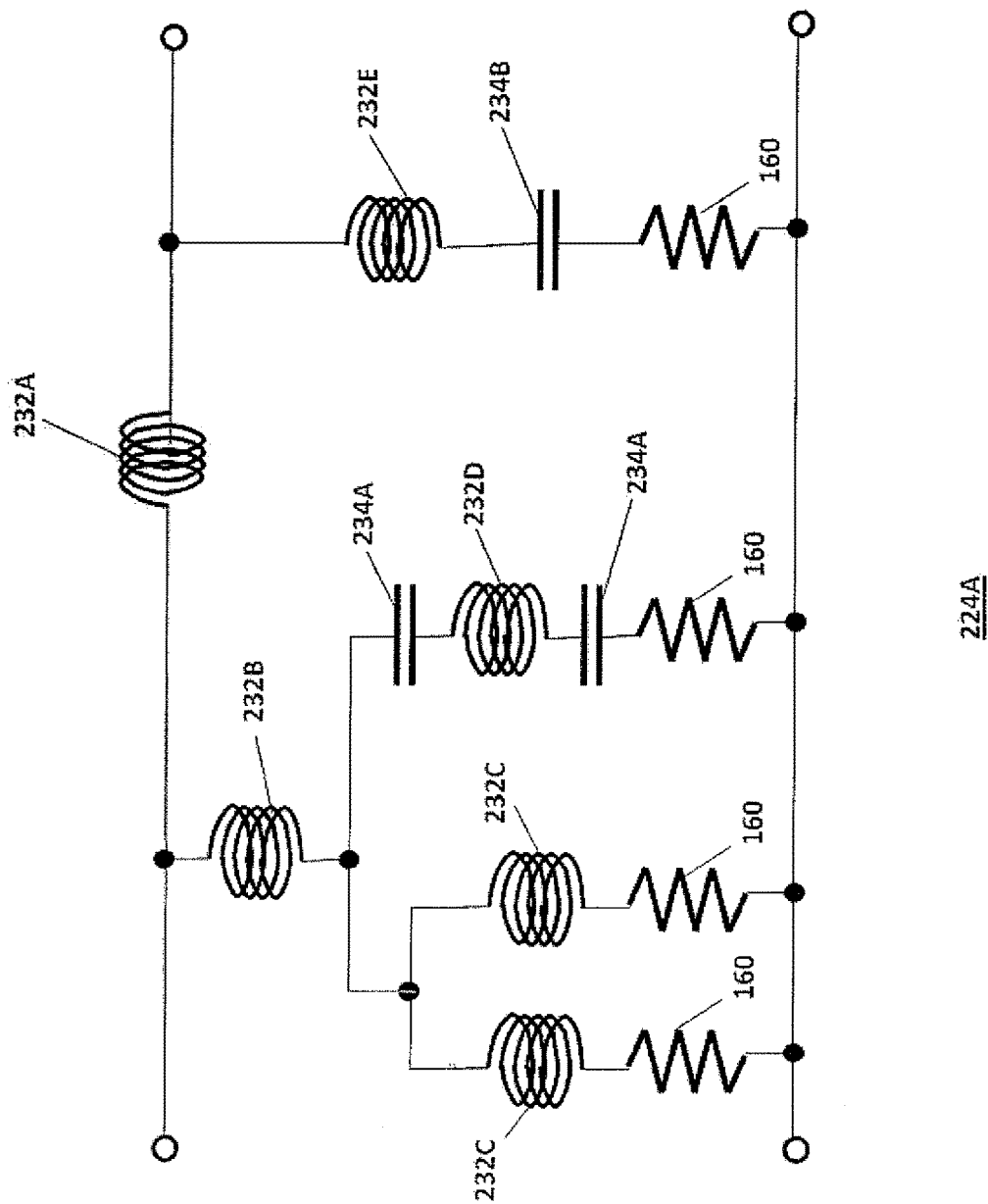
Figure 5E:
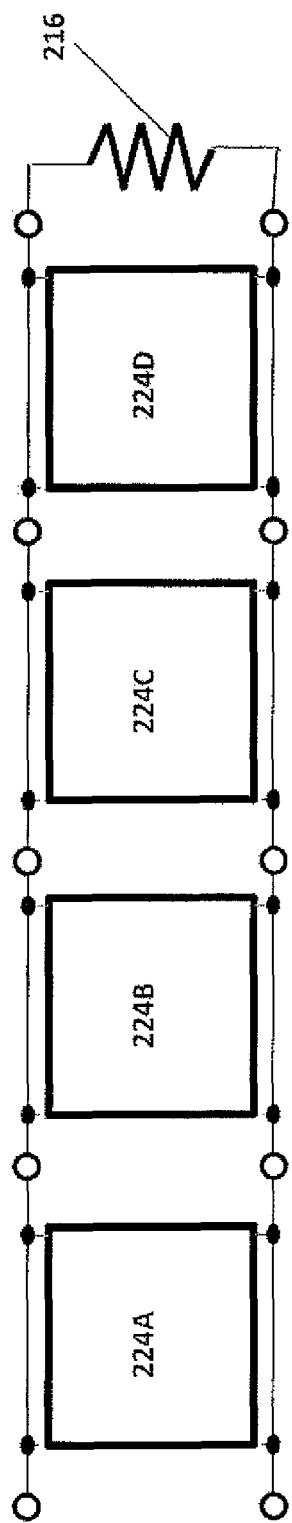

FIG. 5D depicts the RLC circuit diagram corresponding to the localized reactive loads generated by the parallel and anti-parallel current vector alignments introduced along the serpentine path for the additional gate segment 224A shown in FIG. 5C. FIG. 5D assumes terminating resistors 160 are used in all secondary termination points 228. FIG. 5E depicts the RLC circuit diagram for the dielectrically loaded serpentine gate transistor when all of the branched additional gate segments 224A,224B,224C,224D are configured in parallel electrical connection (as shown in FIG. 5B) and has its primary termination 216 terminated with a resistor.

This technique allows a simple circuit layout to easily construct a fairly complex resonant RLC circuit. The complexity of the circuit shown in FIG. 5D requires numerical methods to determine the gate's resonant frequency response, however, this technique provides a simplified construction methods to construct complex circuit that provides greater control in precisely tuning a resonant transistor gate that operates at a desired frequency or range of frequencies. Greater tuning precision is achieved apportioning the dielectric load within coupled gate segments into a plurality of sub-segments 238A,238B,238C,238D,238E in which different materials having varying dielectric densities are inserted.

Figure 5F:
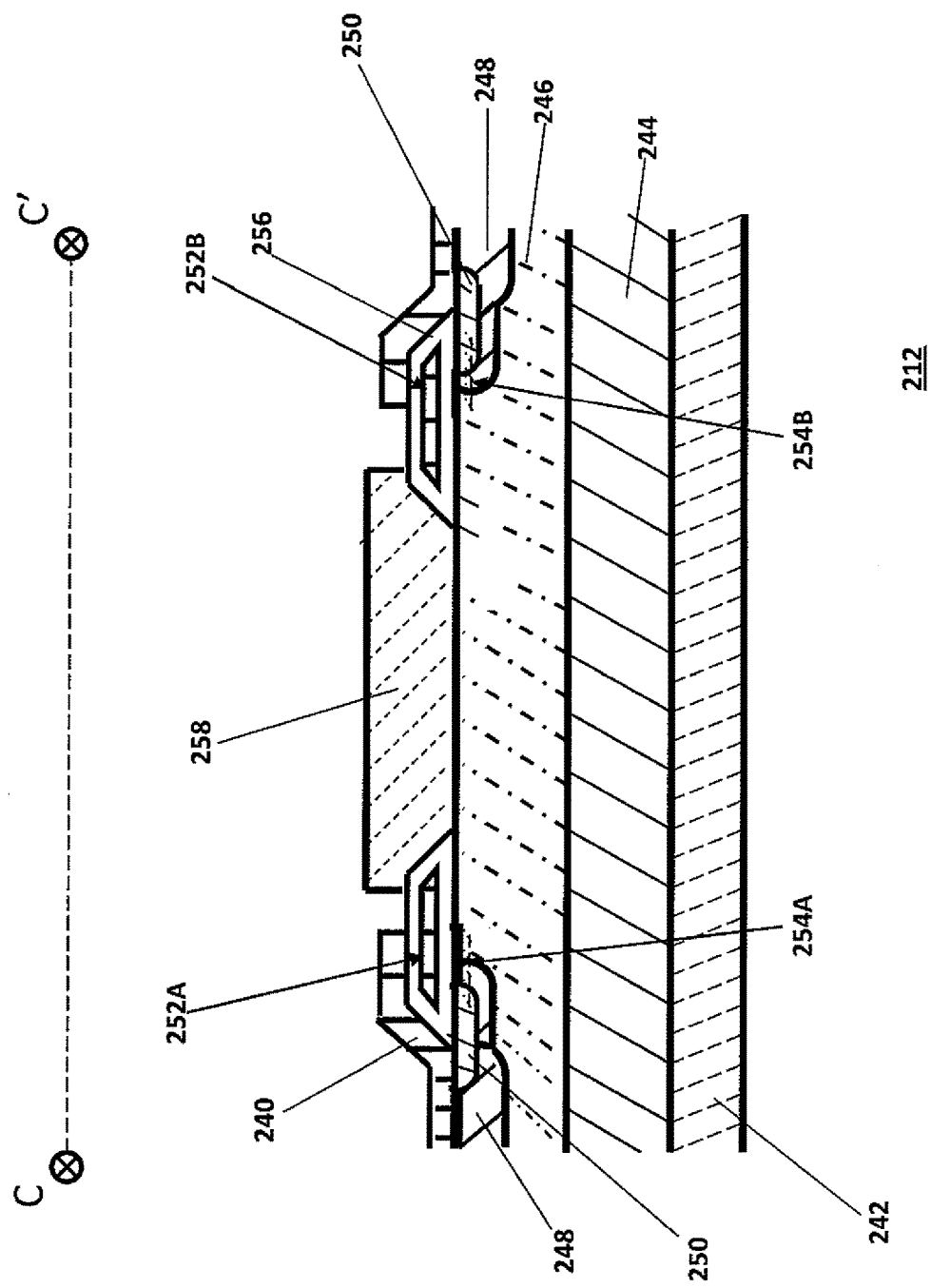

The addition of the dielectric loads alters the construction of the FET. Segments of the dielectrically loaded serpentine resonant gate transistor 212 that are not dielectrically loaded may be constructed in accordance with FIGS. 1D,2C. The addition of dielectric loads displaces the placement of active junctions and overlaying source electrodes. FIG. 5F depicts the C-C' cross-sectional view of a dielectrically loaded serpentine gate transistor 212 configured for operation as a FET. FIG. 5F adds the source electrode 240 not shown in FIGS. 5A-5C. When configured as a vertical FET the dielectrically loaded serpentine resonant gate transistor 212 uses the same semiconductor layered structure as a standard vertical FET. It consists of a drain electrode 242, a semiconductor drain layer 244, an intrinsic n-type semiconductor layer 246 that has p-doped regions 248 that form the active junction and n+-doped regions 250 that form an ohmic contact with the source electrodes 240. A voltage applied to the gate electrodes 252A,252B modulates conductive channels 254A,254B immediately beneath the gate oxide 256, which also insulates the gate electrodes 252A,252B from the source electrode 240. The dielectric load 258 is inserted between the parallel gate electrodes 252A,252B. The purpose of the dielectric load 258 is to enhance electromagnetic coupling between parallel gate electrodes 252A,252B, therefore the semiconductor material immediately beneath the dielectric load 258 is inactive. A barrier material (not shown) may be inserted between the dielectric load 258 and the intrinsic n-type semiconductor layer 246 to prevent the diffusion of elemental components of the dielectric load 258 into the semiconductor layers, if needed.

Figure 6:
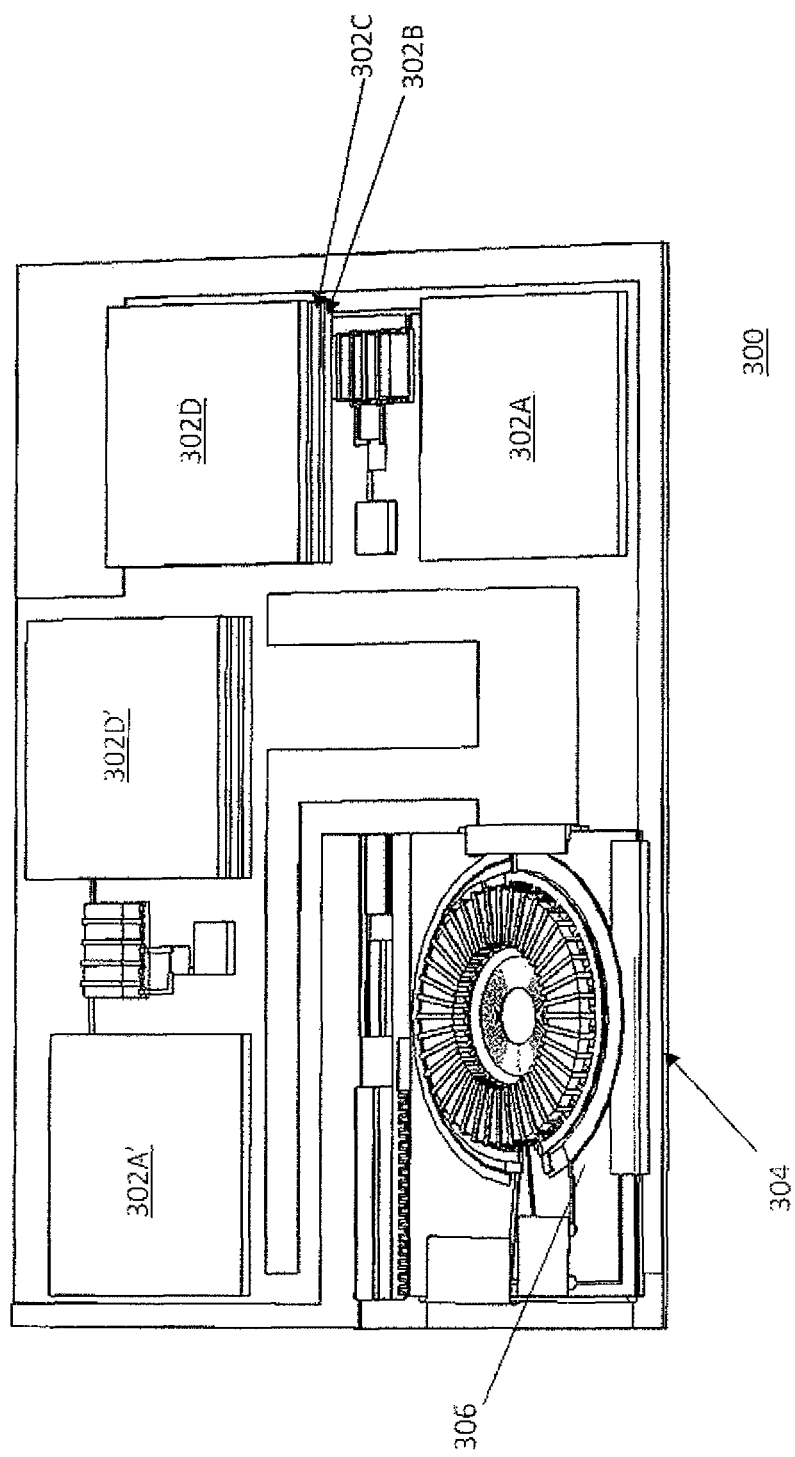
FIG. 6 illustrate a semiconductor carrier comprising a monolithic power management module modulated by a resonant gate transistor formed by embedding dielectric load materials within resonant transistor gate.

A final embodiment of the present invention integrates monolithic power management modules comprising a resonant gate transistor using any of the methods outlined above onto a semiconductor chip carrier. FIG. 6 depicts a chip carrier 300 that electrically interconnects a plurality of semiconductor die 302A, 302B, 302C, 302D, 302A', 302B', 302C', 302D' mounted on a semiconductor substrate 304. At least one monolithic power management module containing a power FET with a resonant gate transistor 306 is formed on the surface of the semiconductor substrate 304. Additional active and passive circuitry may also be embedded within or formed upon the semiconductor substrate 304. Since switching speeds are constrained by the electron mobility, which in silicon is $\mu_{elec}$=1,300 cm$^2$-V$^{-1}$ sec$^{-1}$. It is therefore desirable to utilize semiconductors, such as silicon germanium (SiGe), germanium (Ge), gallium arsenide (GaAs) or other III-V compound semiconductors, or when the application warrants, II-VI compound semiconductors, which have higher electron mobility than silicon (Si) within the monolithic power management module 306.

The present invention is illustratively described above in reference to the disclosed embodiments. Various modifications and changes may be made to the disclosed embodiments by persons skilled in the art without departing from the scope of the present invention as defined in the appended claims.

What is claimed:

1. A semiconductor FET, comprising a resonant gate and source and drain electrodes, wherein the resonant gate is comprises a plurality of parallel connected branches with each branch having integrally constructed reactive components and/or adjacent segments which reactively couple to each other, and further wherein the parallel connected branches are electromagnetically resonant at one or more predetermined frequencies.

2. The FET of claim 1, wherein the reactive components include ceramic dielectric material.

3. The FET of claim 2, wherein the dielectric material has dielectric properties that vary ≤±1% over temperatures in the range of −40° C. to +120° C.

4. The FET of claim 1, further comprising a plurality of embedded capacitive circuit elements electrically connected in series with one or more resonant gate segments to form a lumped capacitance that reduces overall input capacitance of the resonant gate.

5. The FET of claim 1, further comprising dielectric material integrally constructed to affect the reactive coupling between adjacently located segments.

6. The FET of claim 1, wherein the resonant gate forms an elongated resonant transmission line.

7. The FET of claim 6, further comprising reactive and resistive components integrally constructed within the resonant gate to form the elongated resonant transmission line in combination with segments of the resonant gate, which elongated transmission line is resonant at one or more predetermined frequencies.

8. The FET of claim 7, wherein the resistive component is located to terminate the resonant transmission line.

9. The FET of claim 7, wherein one or more resistive components within the resonant gate are adapted to control bandwidth of the resonant gate.

10. The FET of claim 1, wherein gate electrode has a gate width to gate length ratio ≥100.

11. The FET of claim 1, wherein the gate width to gate length ratio is greater than either one thousand, ten thousand, one hundred thousand or one million to one.

12. The FET of claim 1, wherein one or more of the plurality of parallel connected branches is constructed to have a serpentine path.

13. The FET of claim 11, wherein the serpentine path induces electromagnetic coupling between adjacent segments of the resonant gate.

14. The FET of claim 12, wherein the serpentine path obeys a fractal geometry.

15. The FET of claim 1, further comprising a power management module integrated in a monolithic structure with the FET.

16. The FET of claim 15, wherein the integrated FET and monolithic power management module are formed on silicon, silicon germanium, or a III-V compound semiconductor.

17. The FET of claim 1, wherein the FET is a DDMOS, superjunction or IGBT vertical FET, or a surface FET.

18. A power management module, comprising the FET of claim 1.

19. The power management module of claim 18, wherein resonant frequencies of the resonant gate correspond to switching frequencies used in the power management module.

20. A silicon carrier, comprising the FET of claim 1.

* * * * *